US008515104B2

(12) United States Patent
Dickins et al.

(10) Patent No.: US 8,515,104 B2

(45) Date of Patent: Aug. 20, 2013

(54) BINAURAL FILTERS FOR MONOPHONIC COMPATIBILITY AND LOUDSPEAKER COMPATIBILITY

(75) Inventors: Glenn N. Dickins, Jerrabomberra (AU); David S. McGrath, Rose Bay (AU)

(73) Assignee: Dobly Laboratories Licensing Corporation, San Francisco, CA (US)

( * ) Notice: Subject to any disclaimer, the term of this patent is extended or adjusted under 35 U.S.C. 154(b) by 343 days.

(21) Appl. No.: 13/070,289

(22) Filed: Mar. 23, 2011

(65) Prior Publication Data

US 2011/0170721 A1 Jul. 14, 2011

Related U.S. Application Data

(63) Continuation of application No. PCT/US2009/056956, filed on Sep. 15, 2009.

(60) Provisional application No. 61/099,967, filed on Sep. 25, 2008.

(51) Int. Cl.

| | |
|---|---|
| ***H04R 5/02*** | (2006.01) |
| ***H04R 5/00*** | (2006.01) |
| ***H03G 3/00*** | (2006.01) |

(52) U.S. Cl.

USPC .................. 381/309; 381/17; 381/61; 381/63

(58) Field of Classification Search

USPC ............... 381/17, 18, 306, 307, 300, 303, 61, 381/63, 309, 310, 74

See application file for complete search history.

(56) References Cited

U.S. PATENT DOCUMENTS

| | | | | |
|---|---|---|---|---|
| 4,955,057 A * | 9/1990 | Tominari | 381/63 |
| 5,371,799 A * | 12/1994 | Lowe et al. | 381/310 |
| 5,436,975 A | 7/1995 | Lowe et al. | |
| 5,524,053 A | 6/1996 | Iwamatsu | |
| 5,596,644 A * | 1/1997 | Abel et al. | 381/17 |
| 5,761,314 A * | 6/1998 | Inanaga et al. | 381/17 |
| 5,771,396 A | 6/1998 | Arnold | |
| 5,809,149 A * | 9/1998 | Cashion et al. | 381/17 |
| 5,912,976 A | 6/1999 | Klayman et al. | |

(Continued)

FOREIGN PATENT DOCUMENTS

| | | |
|---|---|---|
| CN | 1662101 A | 8/2005 |
| CN | 1956606 A | 5/2007 |

(Continued)

OTHER PUBLICATIONS

International Preliminary Report on Patentability for PCT Application PCT/US2009/056956 mailed Dec. 7, 2010.

(Continued)

*Primary Examiner* — Duc Nguyen

*Assistant Examiner* — Sean H Nguyen

(74) *Attorney, Agent, or Firm* — Dov Rosenfeld; Inventek

(57) ABSTRACT

A method of processing at least one input signal by a set of binaural filters such that the outputs are playable over headphones to provide a sense of listening to sound in a listening room via one or more virtual speakers, with the further property that a monophonic mix down sounds good. Also an apparatus for processing the at least one input signals. Also a method of modifying a pair of binaural filters to achieve the property that a monophonic mix down sounds good, while still providing spatialization when listening through headphones.

36 Claims, 26 Drawing Sheets

(56) References Cited

U.S. PATENT DOCUMENTS

| | | | | |
|---|---|---|---|---|
| 5,943,427 | A * | 8/1999 | Massie et al. | 381/17 |
| 6,009,178 | A | 12/1999 | Abel | |
| 6,067,361 | A | 5/2000 | Kohut et al. | |
| 6,195,434 | B1 | 2/2001 | Cashion et al. | |
| 6,198,826 | B1 | 3/2001 | Cowieson et al. | |
| 6,421,446 | B1 * | 7/2002 | Cashion et al. | 381/17 |
| 6,970,569 | B1 * | 11/2005 | Yamada | 381/310 |
| 7,215,782 | B2 * | 5/2007 | Chen | 381/17 |
| 7,876,903 | B2 * | 1/2011 | Sauk | 381/17 |
| 8,391,504 | B1 * | 3/2013 | Abel et al. | 381/63 |
| 2003/0035553 | A1 | 2/2003 | Baumgarte | |
| 2003/0138116 | A1 | 7/2003 | Jones et al. | |
| 2004/0179696 | A1 * | 9/2004 | Ohta | 381/56 |
| 2004/0213415 | A1 * | 10/2004 | Rama et al. | 381/63 |
| 2005/0147261 | A1 * | 7/2005 | Yeh | 381/92 |
| 2005/0180579 | A1 * | 8/2005 | Baumgarte et al. | 381/63 |
| 2007/0003098 | A1 | 1/2007 | Martenson et al. | |
| 2007/0121951 | A1 * | 5/2007 | Kim | 381/1 |
| 2007/0133831 | A1 * | 6/2007 | Kim et al. | 381/313 |
| 2007/0172086 | A1 * | 7/2007 | Dickins et al. | 381/309 |
| 2007/0223751 | A1 * | 9/2007 | Dickins et al. | 381/310 |
| 2008/0008324 | A1 | 1/2008 | Sim | |
| 2008/0025519 | A1 * | 1/2008 | Yu et al. | 381/17 |
| 2008/0031462 | A1 * | 2/2008 | Walsh et al. | 381/17 |
| 2008/0319739 | A1 * | 12/2008 | Mehrotra et al. | 704/200.1 |
| 2009/0052681 | A1 * | 2/2009 | Schobben et al. | 381/63 |

FOREIGN PATENT DOCUMENTS

| | | | |
|---|---|---|---|
| CN | 101040565 | A | 9/2007 |
| CN | 101263739 | A | 9/2008 |
| JP | 06121394 | | 4/1994 |
| JP | 11-088994 | A | 3/1999 |
| KR | 9305227 | | 8/1993 |
| WO | 9914983 | | 3/1999 |
| WO | 9949574 | | 9/1999 |
| WO | 2005062673 | | 7/2005 |
| WO | 2006071119 | | 7/2005 |
| WO | 2005122640 | | 12/2005 |
| WO | 2006126856 | | 11/2006 |
| WO | WO 2006126857 | | 11/2006 |
| WO | WO 2006126858 | | 11/2006 |
| WO | 2007027051 | | 3/2007 |

OTHER PUBLICATIONS

International Search Report and Written Opinion for PCT Application PCT/US2009/056956 mailed Dec. 22, 2009.

Office Action on Chinese Patent Application No. 200980137321.3 mailed Dec. 14, 2012 and English translation thereof.

Search Report from Chinese Patent Application No. 200980137321.3 mailed Dec. 6, 2012.

Faller, et al., "Binaural Cue Coding—part II: Schemes and Applications" IEEE Transactions on Speech and Audio Processing, IEEE Service Center, New York, NY, US, vol. 11, No. 6, Nov. 1, 2003, pp. 520-531.

Freeland, et al., "Interpositional Transfer Function for 3D-Sound Generation" Journal of the Audio Engineering Society, New York, NY, USA. vol. 52, No. 9, Sep. 1, 2004, pp. 915-930.

Hatziantoniou, et al., "Generalized Fractional-Octave Smoothing of Audio and Acoustic Responses" Journal of the Audio Engineering Society, New York, NY, USA. vol. 48, No. 4, Apr. 1, 2000, pp. 259-279.

Rao, et al., "A Joint Minimax Approach for Binaural Rendering of Audio Through Loudspeakers" 2007 IEEE International Conference on Acoustics, Speech and Signal Processing, p. I-176-6, Conference date: Apr. 15-20, 2007, Honolulu, HI, USA.

Breebaart, et al., "Multi-Channel Goes Mobile: MPEG Surround Binaural Rendering" 29th International Conference: Audio for Mobile and Handheld Devices (Sep. 2006); 13 pages.

Beack, et al., "Multichannel Sound Scene Control for MPEG Surround" p-3 AES Conference: 29th International Conference: Audio for Mobile and Handheld Devices (Sep. 2006).

Herre, et al., "Spatial Audio Coding: Next-Generation Efficient and Compatible Coding of Multi-Channel Audio" Audio Engineering Society, presented at the 117th Convention, Oct. 28-31, 2004, San Francisco, CA, USA. 13 pages.

Schuijers, et al., "Low Complexity Parametric Stereo Coding" Audio Engineering Society, Convention Paper 6073, Presented at the 116th Convention, May 8-1, 2004, Berlin, Germany. p. 11.

Engdegard, et al., "Synthetic Ambience in Parametric Stereo Coding" Audio Engineering Society, Convention Paper 6074, presented at the 116th Convention, May 8-11, 2004, Berlin, Germany. p. 12.

Samsudin, et al., "A Stereo to Mono Downmixing Scheme for MPEG-4 Parametric Stereo Encoder" published on 2006, The Institution of Engineering and Technology, p. V-529-V532.

* cited by examiner

803

```
h_S = (h_L + h_R) / sqrt(2);
h_D = (h_L - h_R) / sqrt(2);
```

805

```
B = min(1,64^2./(1:length(h_L)).^2);
GaussVar = log(sqrt(2))./(2*pi*pi*(B).^2);
ExponVar = GaussVar / 4;
a = (sqrt(4*ExponVar+1)-1)/2./ExponVar;
```

807

```
for p=1:2
  S=0; for (k=1:N ) S=(1-a(k))*S + a(k)*h_S(k); h_S(k)=S; end;
  S=0; for (k=N:-1:1) S=(1-a(k))*S + a(k)*h_S(k); h_S(k)=S; end;
  S=0; for (k=1:N ) S=(1-a(k))*S + a(k)*h_D(k); h_D(k)=S; end;
  S=0; for (k=N:-1:1) S=(1-a(k))*S + a(k)*h_D(k); h_D(k)=S; end;
end;
```

809

```
h_D = (h_L - h_R) - (sqrt(2)-1)*h_D;
```

811

```
h_L_ = (h_S + h_D) / sqrt(2);
h_R_ = (h_S - h_D) / sqrt(2);
```

FIG. 8

BINAURAL FILTERS FOR MONOPHONIC COMPATIBILITY AND LOUDSPEAKER COMPATIBILITY

CROSS-REFERENCE TO RELATED APPLICATIONS

This application is a continuation of International Application No. PCT/US2009/056956 having an international filing date of 15 Sep. 2009. International Application No. PCT/US2009/056956 claims priority to U.S. Patent Provisional Application 61/099,967, filed 25 Sep. 2008. Both International Application No. PCT/US2009/056956 and U.S. Application No. 61/099,967 are hereby incorporated by reference in their entirety.

FIELD OF THE INVENTION

The present disclosure relates generally to signal processing of audio signals, and in particular to processing audio inputs for spatialization by binaural filters such that the output is playable on headphones, or monophonically, or through a set of speakers.

BACKGROUND

It in known to process a set of one or more audio input signals for playback through headphones such that the listener has the impression of listening to sounds from a plurality of virtual speakers located at pre-defined locations in a listening room. Such processing is called spatialization and binauralization herein. The filters that process the audio input signals are called binaural filters herein. If not for such processing, a listener listening through headphones would have the impression that the sound was inside that listener's head. The audio input signals may be a single signal, a pair of signals for stereo reproduction, a plurality of surround sound signals, e.g., four audio input signals for 4.1 surround sound, five audio input signals for 5.1, seven audio input signals for 7.1, and so forth, and further might include individual signals for specific locations, like of a particular source of sound. There is a pair of binaural filters for each audio input signal to be spatialized. For realistic reproduction, the binaural filters take into account the head related transfer functions (HRTFs) from each virtual speaker to each of a left ear and right ear, and further take into account both early echoes and the reverberant response of the listening room being simulated.

Thus it is known to pre-process signals by binaural filters to produce a pair of audio output signals—binauralized signals—for listening through headphones.

It is often the case that one wishes to listen to binauralized signals through a single speaker, that is, monophonically by electronically downmixing the signal for monophonic reproduction. An example is listening through a monophonic loudspeaker in a mobile device. It often also is the case that one wishes to listen to such sounds through a pair of closely spaced loudspeakers. In that latter case, the binauralized output signals are also mixed down, but by audio crosstalk rather than electronically. In both cases, the binauralized then mixed down signal sounds unnatural, in particular sounds reverberant with reduced intelligibility and audio clarity. It is difficult to eliminate this problem without compromising the impression of space and distance in the binauralized audio.

BRIEF DESCRIPTION OF THE DRAWINGS

FIG. 8 shows a portion of code in the syntax of MATLAB™ (Mathworks, Inc., Natick, Mass.) that carries out a method embodiment of converting a pair signals representing binaural filter impulse responses to signals representative of modified impulse responses of binaural filters.

DESCRIPTION OF EXAMPLE EMBODIMENTS

Overview

Figure 1:
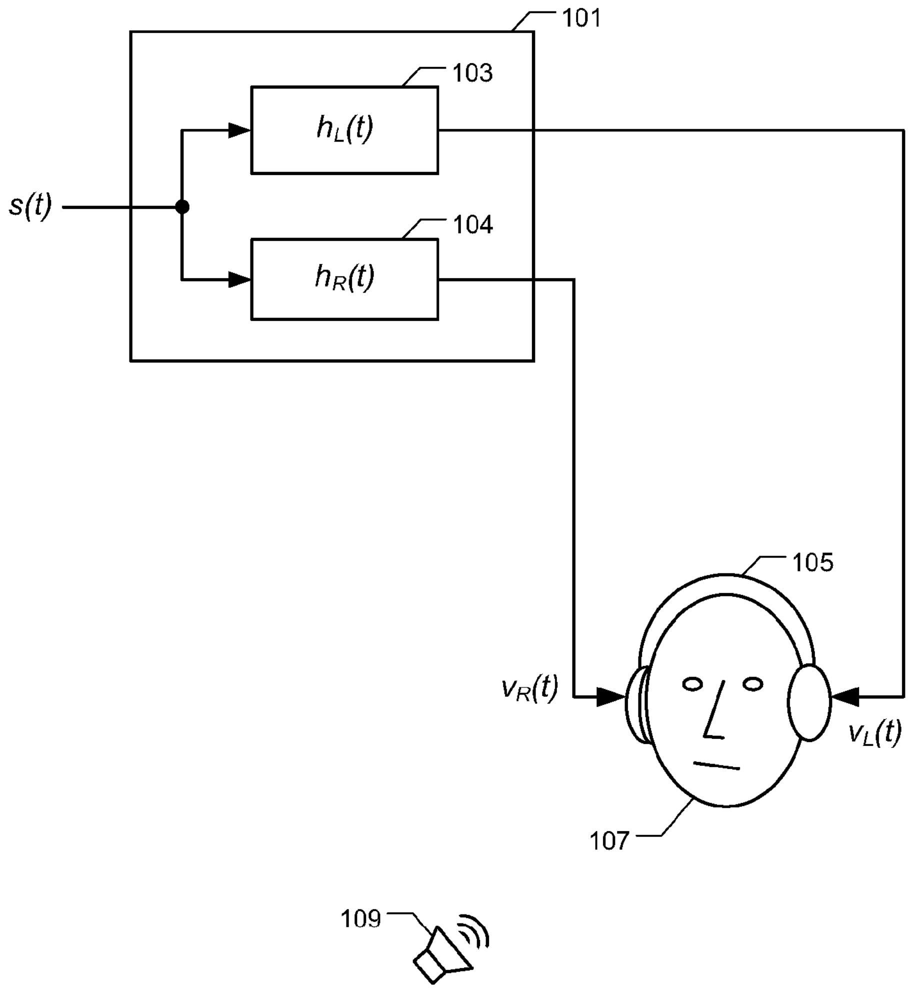
FIG. 1 shows a simplified block diagram of a binauralizer that includes a pair of binaural filters for processing a single input signal and that include an embodiment of the present invention.

Embodiments of the present invention includes a method, an apparatus, and program logic, e.g., program logic encoded in a computer readable medium that when executed cause carrying out of the method. One method is of processing one or more audio input signals for rendering over headphones using binaural filters to achieve virtual spatializing of the one or more audio inputs with the additional the property that the binauralized signals sound good when played back monophonically after downmixing or when played back through relatively closely spaced loudspeakers. Another method is of operating a data processing system for processing one or more pairs of binaural filter characteristics, e.g., binaural filter impulse responses to determine corresponding one or more pairs of modified binaural filter characteristics, e.g., modified binaural filter impulse responses, so that when one or more audio input signals are binauralized by respective one or more pairs of binaural filters having the one or more pairs of modified binaural filter characteristics, the binauralized signals achieve virtual spatializing of the one or more audio inputs with the additional property that the binauralized signals sound good when played back monophonically after downmixing or over relatively closely spaced loudspeakers.

Particular embodiments include an apparatus for binauralizing a set of one or more audio input signals. The apparatus includes a pair of binaural filters characterized by one or more pairs of base binaural filters, with one pair of base binaural filters for each of the audio signal inputs. Each pair of base binaural filters is representable by a base left ear filter and a base right ear filter, and further representable by a base sum filter and a base difference filter. Each filter is characterizable by a respective impulse response.

At least one pair of base binaural filters is configured to spatialize its respective audio signal input to incorporate a direct response to a listener from a respective virtual speaker location, and to incorporate both early echoes and a reverberant response of a listening room.

For the at least one pair of base binaural filters:

The time-frequency characteristics of the base sum filter are substantially different from the time-frequency characteristics of the base difference filter, with the base sum filter length significantly smaller than the base difference filter length, the base left ear filter length, and the base right ear filter length at all frequencies.

The base sum filter length varies significantly across different frequencies compared to the variation over frequencies of the base left ear filter length or of the base right ear filter length, with the base sum filter length decreasing with increasing frequency.

The apparatus generated output signals that are playable either through headphones or monophonically after a monophonic mix.

In some embodiments, for the at least one pair of base binaural filters, the transition of the base sum filter impulse response to an insignificant level occurs gradually over time in a frequency dependent manner over an initial time interval of the base sum filter impulse response.

For some embodiments, for the at least one pair of base binaural filters, the base sum filter decreases in frequency content from being initially full bandwidth towards a low frequency cutoff over the transition time interval. For example, for the at least one pair of base binaural filters, the transition time interval is such that the base sum filter impulse response transitions from full bandwidth up to about 3 ms to below 100 Hz at about 40 ms.

In some embodiments, for the at least one pair of base binaural filters, the base difference filter length at high frequencies of above 10 kHz is less than 40 ms, the base difference filter length at frequencies of between 3 kHz and 4 kHz, is less 100 ms, and at frequencies less than 2 kHz, the base difference filter length is less than 160 ms. For some of these embodiments, the base difference filter length at high frequencies of above 10 kHz is less than 20 ms, the base difference filter length at frequencies of between 3 kHz and 4 kHz, is less 60 ms, and at frequencies less than 2 kHz, the base difference filter length is less than 120 ms. For some of these embodiments, the base difference filter length at high frequencies of above 10 kHz is less than 10 ms, the base difference filter length at frequencies of between 3 kHz and 4 kHz, is less 40 ms, and at frequencies less than 2 kHz, the base difference filter length is less than 80 ms.

In some embodiments, for the at least one pair of base binaural filters, the base difference filter length is less than about 800 ms. In some of these embodiments, the base difference filter length is less than about 400 ms. In some of these embodiments, the base difference filter length is less than about 200 ms.

In some embodiments, for the at least one pair of base binaural filters, the base sum filter length decreasing with increasing frequency, the base sum filter length for all frequencies less than 100 Hz is at least 40 ms and at most 160 ms, the base sum filter length for all frequencies between 100 Hz and 1 kHz is at least 20 ms and at most 80 ms, the base sum filter length for all frequencies between 1 kHz and 2 kHz is at least 10 ms and at most 20 ms, and the base sum filter length for all frequencies between 2 kHz and 20 kHz is at least 5 ms and at most 20 ms. In some of these embodiments, the base sum filter length for all frequencies less that 100 Hz is at least 60 ms and at most 120 ms, the base sum filter length for all frequencies between 100 Hz and 1 kHz is at least 30 ms and at most 60 ms, the base sum filter length for all frequencies between 1 kHz and 2 kHz is at least 15 ms and at most 30 ms, and the base sum filter length for all frequencies between 2 kHz and 20 kHz is at least 7 ms and at most 15 ms. Furthermore, in some of these embodiments, the base sum filter length for all frequencies less that 100 Hz is at least 70 ms and at most 90 ms, the base sum filter length for all frequencies between 100 Hz and 1 kHz is at least 35 ms and at most 50 ms, the base sum filter length for all frequencies between 1 kHz and 2 kHz is at least 18 ms and at most 25 ms, and the base sum filter length for all frequencies between 2 kHz and 20 kHz is at least 8 ms and at most 12 ms.

In some embodiments, for the at least one pair of base binaural filters, the base binaural filter characteristics are determined from a pair of to-be-matched binaural filter characteristics. For some such embodiments, for at least one pair of base binaural filters, the base difference filter impulse response is at later times substantially proportional to the difference filter of the to-be-matched binaural filter. For example, the base difference filter impulse response becomes after 40 ms substantially proportional to the difference filter of the to-be-matched binaural filter.

Particular embodiments include a method of binauralizing a set of one or more audio input signals. The method comprises filtering the set of audio input signals by a binauralizer characterized by one or more pairs of base binaural filters. The base binaural filters, in different embodiments, are as described in above in this Overview Section in describing particular apparatus embodiments.

Particular embodiments include a method of operating a signal processing apparatus. The method includes accepting a pair of signals representing the impulse responses of a corresponding pair of to-be-matched binaural filters configured to binauralize an audio signal, and processing the pair of accepted signals by a pair of filters each characterized by a modifying filter that has time varying filter characteristics. The processing forms a pair of modified signals representing the impulse responses of a corresponding pair of modified binaural filters. The modified binaural filters are configured to binauralize an audio signal and further have the property that of a low perceived reverberation in a monophonic mix down, and minimal impact on the binaural filters over headphones.

In some embodiments, the modified binaural filters are characterizable by a modified sum filter and a modified difference filters. The time varying filters are configured such that modified binaural filters impulse responses include a direct part defined by head related transfer functions for a listener listening to a virtual speaker at a predefined location. Furthermore, the modified sum filter has a significantly reduced level and a significantly shorter reverberation time compared to the modified difference filter, and there is a smooth transition from the direct part of the impulse response of the sum filter to the negligible response part of the sum filter, with smooth transition being frequency selective over time.

In different embodiments, the modified binaural filters have the properties of the base binaural filters described above in this Overview Section for the particular apparatus embodiments.

Particular embodiments include a method of operating a signal processing apparatus. The method includes accepting a left ear signal and right ear signal representing the impulse responses of corresponding left ear and right ear binaural filters configured to binauralize an audio signal. The method further includes shuffling the left ear signal and right ear signal to form a sum signal proportional to the sum of the left and right ear signals and a difference signal proportional to difference between the left ear signal and the right ear signal. The method further includes filtering the sum signal by a sum filter that has time varying filter characteristics, the filtering forming a filtered sum signal, and processing the difference signal by a difference filter that is characterized by the sum filter, the processing forming a filtered difference signal. The method further includes unshuffling the filtered sum signal and the filtered difference signal to form modified a modified left ear signal and modified right ear signal representing the impulse responses of corresponding left ear and right ear modified binaural filters. The modified binaural filters are configured to binauralize an audio signal, are representable by a modified sum filter and a modified difference filters. In different embodiments, the modified binaural filters have the properties of the base binaural filters described above in this Overview Section for the particular apparatus embodiments.

Particular embodiments include program logic that when executed by at least one processor of a processing system causes carrying out any of the method embodiments described above in this Overview Section for the particular apparatus embodiments.

Particular embodiments include a computer readable medium having therein program logic that when executed by at least one processor of a processing system causes carrying out any of the method embodiments described above in this Overview Section for the particular apparatus embodiments.

Particular embodiments include an apparatus. The apparatus comprises a processing system that has at least one processor, and a storage device. The storage device is configured with program logic that causes when executed the apparatus to carry out any of the method embodiments described above in this Overview Section for the particular apparatus embodiments.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Binaural Filters and Notation

FIG. 1 shows a simplified block diagram of a binauralizer 101 that includes a pair of binaural filters 103, 104 for processing a single input signal. While binaural filters are generally known in the art, binaural filters that include the monophonic playback features described herein are not prior art.

To proceed with this description, some notation is introduced. For compactness of explanation, the signals are presented herein as continuous time functions. However it should be evident to anyone skilled in the area of signal processing that the framework applies equally well to discrete time signals, that is, to signals that have been suitably sampled and quantized. Such signals are typically indexed by an integer that represents sampled instants in time. Convolution integrals become convolution sums, and so forth. Furthermore, those in the art will understand that the described filters may be implemented in either the time domain or the frequency domain, or even a combination of both, and further may be implemented as finite impulse response FIR implementations, recursive infinite impulse response (IIR) approximations, time delays, and so forth. Those details are left out of the description.

Furthermore, while the described methods are generally applicable and easily generalized to any number of input source signals. It should also be noted that this description and formulation is not particular to any specific set of individualized head related transfer functions, or to any particular synthetic or general head related transfer functions. The technique can be applied to any desired binaural response.

Referring to FIG. 1, denote by u(t) a single audio signal to be binauralized by the binauralizer 101 for binaural rendering through headphones 105, and denote by $h_L(t)$ and $h_R(t)$, respectively, the binaural filter impulse responses for the left and right ear, respectively, for a listener 107 in a listening room. The binauralizer is designed to provide to the listener 105 the sensation of listening to the sound of signal u(t) coming from a source—a "virtual loudspeaker" 109 at a pre-defined location.

There is a significant amount of prior art related to the design, approximation and implementation of binaural filters to achieve such virtual spatial positioning of sources by suitable design of the binaural filters 103 and 104. The filters take into account each ear's head related transfer function (HRTF) as if the speaker 109 was in a perfect anechoic room, that is, to take into account the spatial dimensions of the listening directly from the virtual speaker 109 and further take into account both early reflections in the listening environment, and reverberation. For more details on how some binaural filters are designed, see, for example, International Patent Application No. PCT/AU98/00769 published as WO 9914983 and titled UTILIZATION OF FILTERING EFFECTS IN STEREO HEADPHONE DEVICES and International Patent Application No. PCT/AU99/00002 published as WO 9949574 and titled AUDIO SIGNAL PROCESSING METHOD AND APPARATUS. Each of these applications designates the United States. The contents of each of publications WO 9914983 and WO 9949574 are incorporated herein by reference.

Thus, signals that have been binauralized for headphone use may be available. The binauralization processing of the signals may be by one or more pre-defined binaural filters that are provided so that a listener has the sensation of listening to content in different type of rooms. One commercial binauralization is known as DOLBY HEADPHONE™. The binaural filters pairs in DOLBY HEADPHONE™ binauralization have respective impulse responses with a common non-spatial reverberant tail. Furthermore, some DOLBY HEADPHONE™ implementations offer only a single set of binaural filters describing a single typical listening room, while other can binauralize using one of three different sets of binaural filters, denoted DH1, DH2, and DH3. These have the following properties:

DH1 provides the sensation of listening in a small, well-damped room appropriate for both movies and music-only recordings.

DH2 provides the sensation of listening in a more acoustically live room particularly suited to music listening.

DH3 provides the sensation of listening in a larger room, more like a concert hall or a movie theater.

Denote the convolution operation by ⊗, that is, the convolution of a(t) and b(t) is denoted as $$a \otimes b = \int a(t-\tau)b(\tau)\cdot d\tau = \int a(\tau)b(t-\tau)\cdot d\tau,$$

where the time dependence is not explicitly shown on the left hand side, but would be implied by the use of a letter. Non-time dependent quantities will be clearly indicated.

A binaural output includes a left output signal denoted $v_L(t)$ and a right ear signal denoted $v_R(t)$. The binaural output is produced by convolving the source signal u(t) with the left and right impulse responses of the binaural filters 103, 104:

$$v_L = h_L \otimes u \text{ Left output signal} \quad (1)$$

$$v_R = h_R \otimes u \text{ Right output signal} \quad (2)$$

Figure 2:
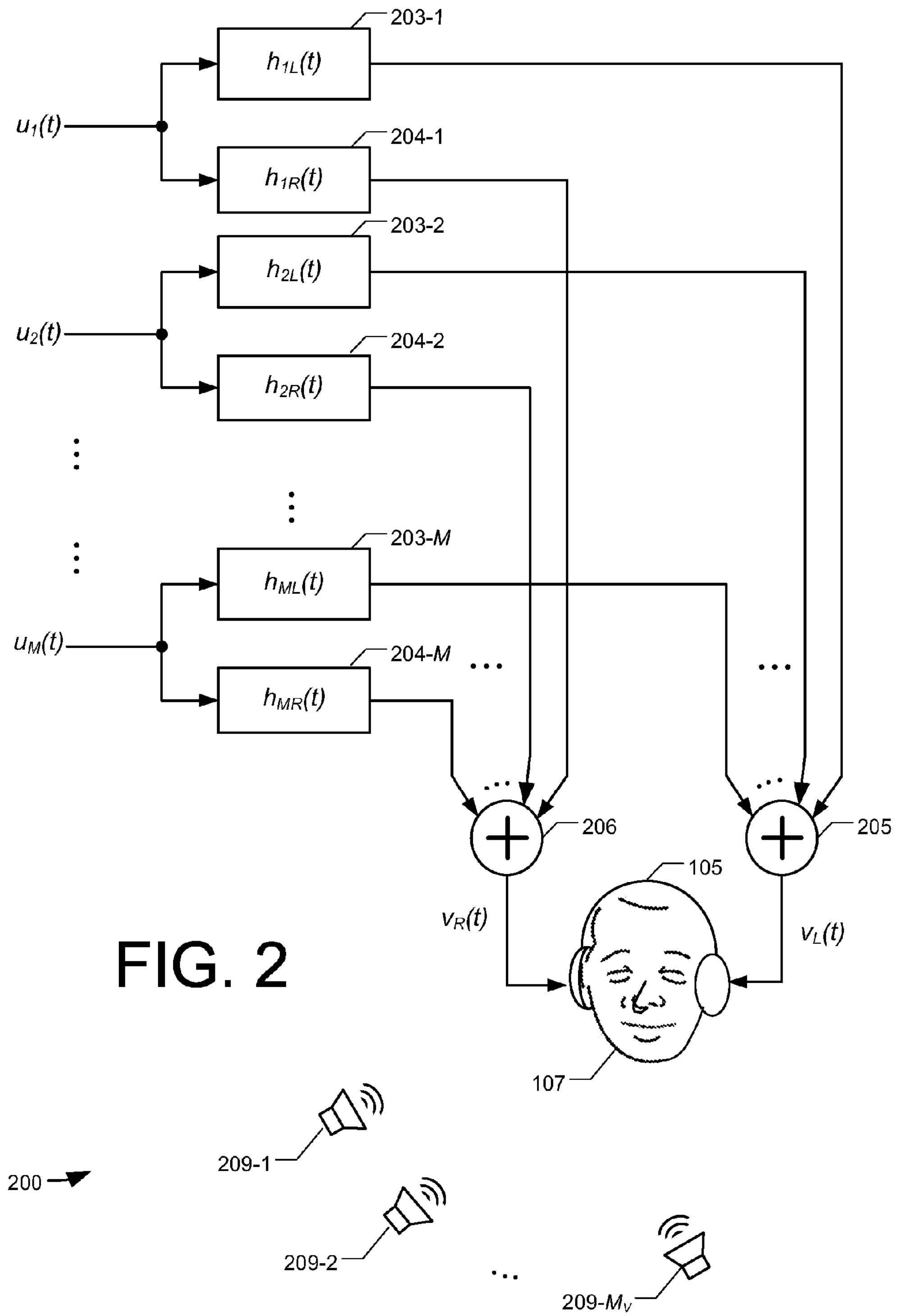
FIG. 2 shows a simplified block diagram of a binauralizer that includes one or more pairs of binaural filters for processing corresponding one or more input signals and that include an embodiment of the present invention.

FIG. 1 shows a single input audio signal. FIG. 2 shows a simplified block diagram of a binauralizer that has one or more audio input signals denoted $u_1(t)$, $u_2(t)$, . . . $u_M(t)$, where M is the number of input audio signals. M can be one, or more than 1. M=2 for stereo reproduction, and more for surround sound signals, e.g., M=4 for 4.1 surround sound, M=5 for 5.1 surround sound, M=7 for 7.1 surround sound, and so forth. One also can have multiple sources, e.g., a plurality of inputs for general background, plus one or more inputs to locate particular sources, such as people speaking in an environment. There is a pair of binaural filters for each audio input signal to be spatialized. For realistic reproduction, the binaural filters take into account the respective head related transfer functions (HRTFs) for each virtual speaker location and left and right ears, and further take into account both early echoes and reverberant response of the listening room being simulated. The left and right binaural filters for the binauralizer shown include left ear binauralizers and right each binauralizers 203-1 and 204-1, 203-2 and 204-2, . . . , 203-M and 204-M having impulse responses $h_{1L}(t)$ and $h_{1R}(t)$, $h_{2L}(t)$ and $h_{2R}(t)$, . . . , $h_{ML}(t)$ and $h_{MR}(t)$, respectively. The left ear and right ear outputs are added by adders 205 and 206 to produce outputs $v_L(t)$ and $v_R(t)$.

The number of virtual speakers is denoted by $M_v$. Such speakers are shown as speakers 209-1, 209-2, . . . , 2-09-$M_v$ at $M_v$ respective locations in FIG. 2. While typically, $M=M_v$, this is not necessary. For example, upmixing may be incorporated to spatialize a pair of stereo input signals to sound to the listener on headphones as if there are five virtual loudspeakers.

In the description herein, operations with and characteristics of a single pair of binaural filters is discussed. Those in the art will understand that such operations with and characteristics of the binaural filter pairs apply to each binaural filter pair in the configuration such as shown in FIG. 2.

Figure 3:
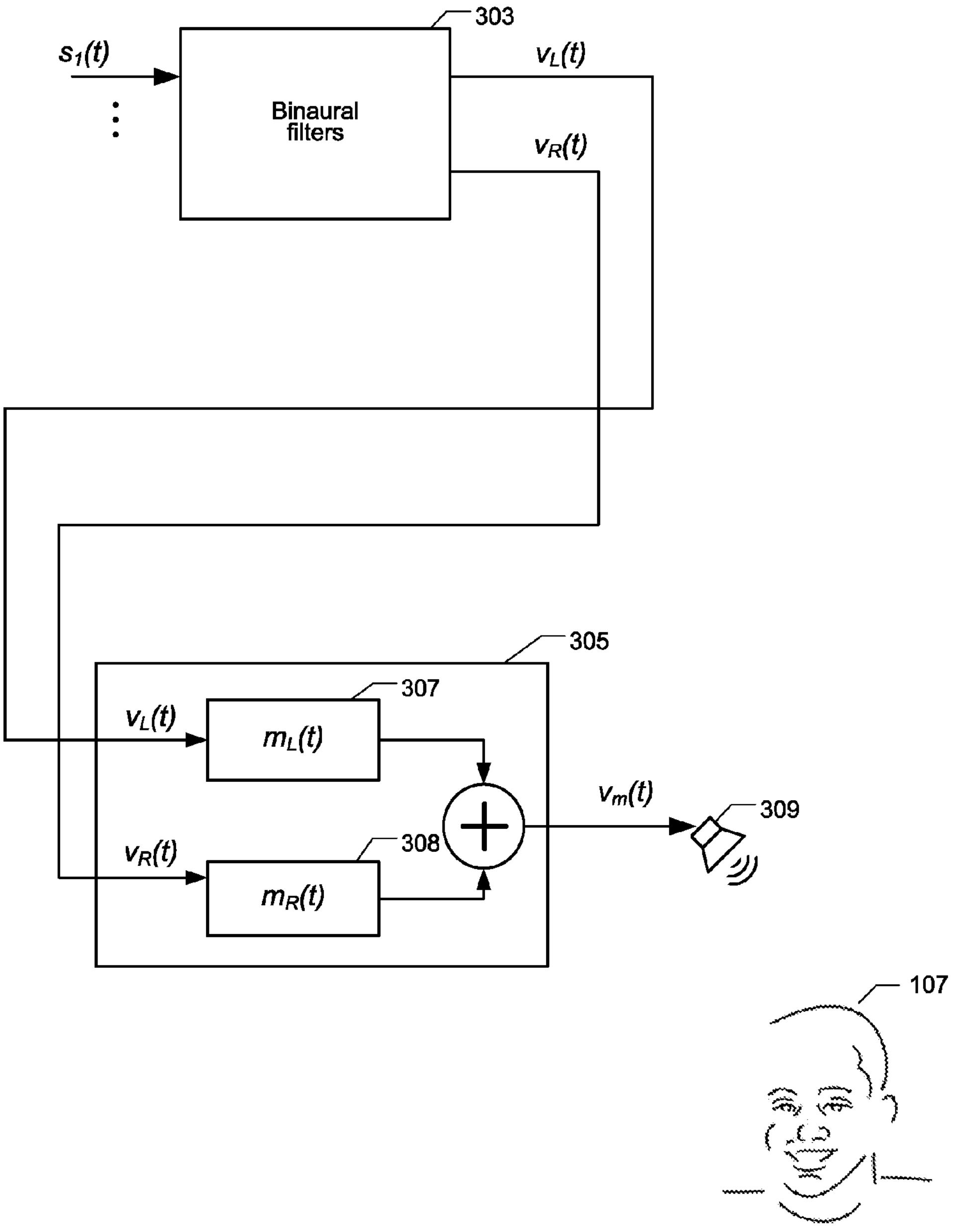
FIG. 3 shows a simplified block diagram of a binauralizer having one or more audio input signals and generating left ear and right ear output signals that are mixed down to a monophonic mix and that can include an embodiment of the present invention.

FIG. 3 shows a simplified block diagram of a binauralizer 303 having one or more audio input signals and generating a left output signal $v_L(t)$ and a right ear signal denoted $v_R(t)$. Denote by $v_M(t)$ a monophonic mix down of the left and right output signals obtained by down-mixer 305 that carries out some filtering on each of the left and right signals $v_L(t)$ and a right ear signal denoted $v_R(t)$ and adds, i.e., mixes the filtered signals. The description that follows assumes a single input u(t). Denote by $m_L(t)$ and $m_R(t)$ the impulse responses of the filters 307 and 308 on the left and right output signals, respectively, of the down-mixer 305. The description that follows assumes a single input u(t). Similar operations occur for each such input. The monophonic mix down is then $$v_m = m_L \otimes v_L \otimes m_R \otimes v_R = (m_L \otimes h_L + m_R \otimes h_R) \otimes u \quad (3)$$

For ideal monophonic compatibility, it is desired that the monophonic mix is the same as (or proportional to) the initial signal u(t). That is, that $v_M(t)=\alpha u(t)$, where $\alpha$ is some scale factor constant. For this to apply, assuming $\alpha=1$, the following identity would ideally need to apply:

$$m_L \otimes h_L + m_R \otimes h_R = \delta \quad (4)$$

where $\delta(t)$ is the unity integral kernel, also called the Dirac delta function defined such that $u \otimes \delta = u$. In discrete processing, the desired result is that $m_L \otimes h_L + m_R \otimes h_R$—each impulse response being a discrete function—is proportional to a unit impulse response. Of course, in a practical implementation, the calculations take time, so to be implemented with actual causal filters, the requirement for "perfect" monophonic compatibility is that $m_L \otimes h_L + m_R \otimes h_R$ is a time delayed and scaled version of the unit impulse.

For simple monophonic mixing, $m_L(t)=m_R(t)=\delta(t)$. That is, $v_M = v_L + v_R = (h_L + h_R) \otimes u$. So for simple monophonic mixing, ideally, for perfect reproduction of a monophonic mix of the binauralized outputs, $$h_L(t) + h_R(t) = \delta(t). \quad (5)$$

It is desirable that $h_L(t)$ and $h_R(t)$ provide good binauralization, i.e., that the rendering of the outputs sounds natural via headphones as if the sound is from the virtual speaker location(s) and in a real listening room. It is further desirable that the monophonic mix of the binaural outputs when rendered sounds like the audio input u(t).

Those in the art of audio signal processing will be familiar with expressing binaural filtering operations on a set of stereo signals by first carrying out shuffling of the left and right binaural signals to generate a sum channel and a difference channel.

Ideally, for a left input and a right stereo or binaural input $u_L(t)$ and $u_R(t)$, the sum and difference signals, denoted by $u_S(t)$ and $u_D(t)$:

$$u_S(t) = \frac{u_L(t) + u_R(t)}{\sqrt{2}} \tag{6}$$

$$u_D(t) = \frac{u_L(t) - u_R(t)}{\sqrt{2}}$$

The inverse relationship also is carried out by a shuffling operation:

$$u_L(t) = \frac{u_S(t) + u_D(t)}{\sqrt{2}} \tag{7}$$

$$u_R(t) = \frac{u_S(t) - u_D(t)}{\sqrt{2}}.$$

With shuffling, the binaural filter impulse responses can be expressed as a sum filter having impulse response denoted $h_S(t)$, and a difference filter having impulse response denoted $h_D(t)$ that generate binaurally filtered sum and difference signals denoted $v_S(t)$ and $v_D(t)$, respectively so that $v_S = h_S \otimes u_S$ and $v_D = h_D \otimes u_D$ where $$h_S(t) = \frac{h_L(t) + h_R(t)}{\sqrt{2}} \tag{8a}$$

$$h_D(t) = \frac{h_L(t) - h_R(t)}{\sqrt{2}}.$$

The inverse relationship between the left ear and right ear binaural filter impulse responses also is carried out by a shuffling operation:

$$h_L(t) = \frac{h_S(t) + h_D(t)}{\sqrt{2}} \tag{9a}$$

$$h_R(t) = \frac{h_S(t) - h_D(t)}{\sqrt{2}}.$$

In this description, characteristics of the sum filter having impulse response $h_S(t)$ and of the difference filter having impulse response $h_D(t)$ related to the left and right ear binaural filters $h_L(t)$ and $h_R(t)$ are discussed. These sum and difference filters are defined for each binaural filter pair. Stereo inputs were discussed above purely to illustrate. Of course, the existence of sum and difference filters does not depend on there being stereo or any particular number of inputs. A sum and difference filter is defined for every binaural filter pair.

Figure 4A:
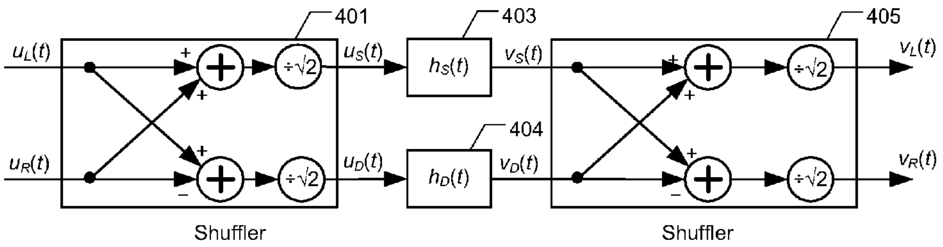
FIG. 4A shows a shuffling operation followed by sum and difference filtering according to a binaural filter pair that can include an embodiment of the present invention, followed by a de-shuffling operation.

FIG. 4A shows a simplified block diagram of a shuffling operation by a shuffler 401 on a left ear stereo signal $u_L(t)$ and a right ear stereo signal $u_R(t)$, followed by a sum filter 403 and a difference filter 404 having sum filter impulse response and difference filter impulse response $h_S(t)$ and $h_D(t)$, respectively, followed by a de-shuffler 405, essentially a shuffler and a halver of each signal, to produce a left ear binaural signal output $v_L(t)$ and a right ear binaural signal output $v_R(t)$.

Figure 4B:
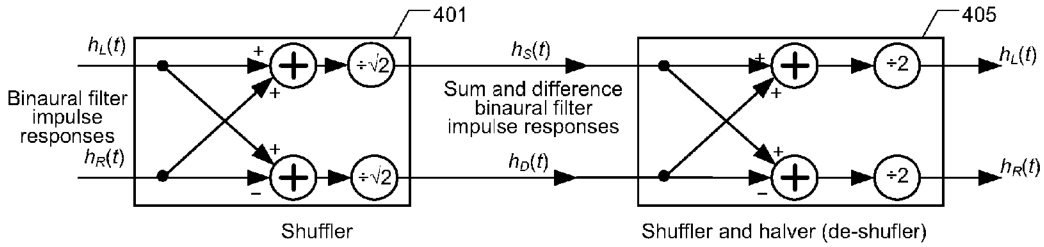
FIG. 4B shows a shuffling operation on left and right input signals representing the impulse responses of binaural filters that can include an embodiment of the present invention followed by a de-shuffling operation.

Because impulse responses are time signals—the responses to a unit impulse input—filtering and other signal processing operations are performable on them just like any other signals. FIG. 4B shows simplified block diagram of a shuffling operation by the shuffler 401 on a left ear binaural filter impulse response $h_L(t)$ and a right ear binaural filter impulse response $h_R(t)$ to generate the sum filter binaural impulse response $h_S(t)$ and the difference filter binaural impulse response $h_D(t)$. Also shown is de-shuffling by the de-shuffler 405, essentially a shuffler and a halver, to give back the left ear binaural filter impulse response $h_L(t)$ and the right ear binaural filter impulse response $h_R(t)$.

Note that because of linearity, often in practice, the $\sqrt{2}$ factor is left out of the shuffling, and scale factor of 2 is added to the unshuffled outputs, so that in some embodiments:

$$u_S(t) = u_L(t) + u_R(t)$$

$$u_D(t) = u_L(t) - u_R(t) \tag{8b}$$

and $$u_L(t) = \frac{u_S(t) + u_D(t)}{2} \tag{9b}$$

$$u_R(t) = \frac{u_S(t) - u_D(t)}{2}.$$

Therefore, in the description herein, all quantities can be scaled appropriately, as would be clear to those in the art.

Designing the Binaural Filters

Particular embodiments of the invention include a method of operating a signal processing apparatus to modify a provided pair of binaural filter characteristics to determine a pair of modified binaural filter characteristics. One embodiment of the method includes accepting a pair of signals representing the impulse responses of a corresponding pair of binaural filters that are configured to binauralize an audio signal. The method further includes processing the pair of accepted signals by a pair of filters each characterized by a modifying filter that has time varying filter characteristics, the processing forming a pair of modified signals representing the impulse responses of a corresponding pair of modified binaural filters. The modified binaural filters are configured to binauralize an audio signal to a pair of binauralized signals and further have the property that a monophonic mix of the binauralized signals sounds natural to a listener.

Consider a set of binaural filters having left ear and right ear impulse responses $h_L(t)$ and $h_R(t)$, respectively. As described above, for a monophonic mix as described in Eq. (3), for ideal perfect monophonic compatibility, the following identity would ideally need to apply, ignoring any constants of proportionality:

$$m_L \otimes h_L + m_R \otimes h_R = \delta \tag{4}$$

For simple monophonic mixing, ideally $$h_L(t) + h_R(t) = \delta(t). \tag{5}$$

We call the property that the monophonic mix of the binaural outputs when rendered sounds like the audio input u(t) "monophonic playback compatibility," or simply monophonic compatibility." In addition to monophonic playback compatibility, it is desirable that $h_L(t)$ and $h_R(t)$ provide good binauralization, i.e., that the rendering of the outputs sounds natural via headphones as if the sound is from the virtual speaker location(s) and in a real listening room. It is further desirable to accommodate the case that the binauralized audio includes several different audio input sources mixed together with different virtual speaker positions and thus different binaural filter pairs. It would be desirable that the monophonic filters are simple to implement, and preferably compatible with general practice for monophonic down mixing of stereo content. The constraint of Eq. (5) is not generally possible without a significant impact on the directional and distance characteristics of the binaural impulse response. It implies that other than the initial impulse or tap of the filter impulse response, $h_R(t)=-h_L(t)$ for $t>0$. In other words, when the binaural filters are expressed as sum and difference filters with impulse responses $h_S(t)$ and $h_D(t)$, $h_S(t)=0$ for $t>0$.

It is not immediately apparent that this constraint could be realized in any way without a significant impact on the binaural response. It requires that the bulk of the binaural impulse response has a correlation coefficient of −1. That is, the impulse response will be identical with a sign reversal.

Figure 5:
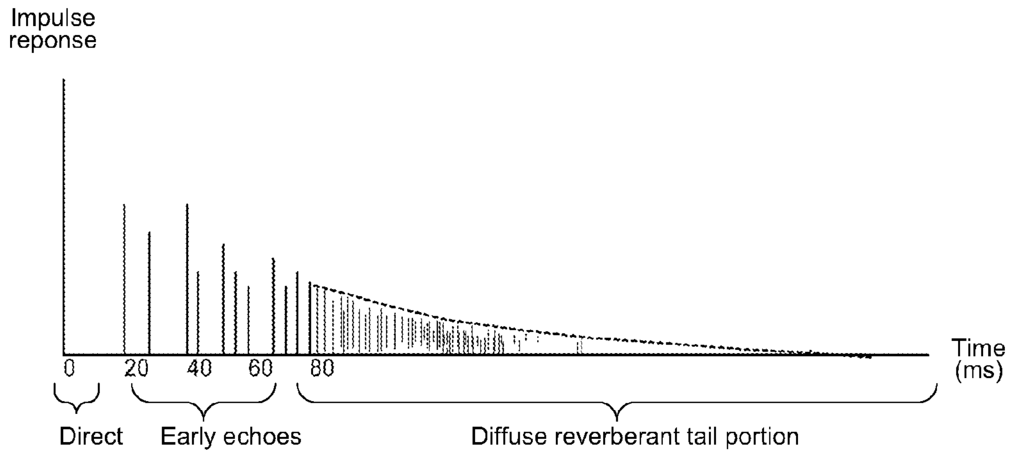
FIG. 5 shows an example binaural filter impulse response.

FIG. 5 shows in simplified form a typical binaural filter impulse response, say for the sum filter $h_S(t)$ or for either the left or right ear binaural filter. The general form of such an acoustical impulse response includes the direct sound, some early reflections, and a later part of the response consisting of closely spaced reflections and thus well approximated by a diffuse reverberation.

Suppose one is provided with left and right ear binaural filters with impulse responses $h_{L0}(t)$ and $h_{R0}(t)$, respectively, and suppose these provide satisfactory binauralization. One aspect of the invention is a set of binaural filters defined by impulse responses $h_L(t)$ and $h_R(t)$ that also provide satisfactory binauralization, e.g., similar to a set of given filters $h_{L0}(t)$ and $h_{R0}(t)$, but whose outputs also sound good when mixed down to a monophonic signal. Discussed is how $h_L(t)$ and $h_R(t)$ compare to $h_{L0}$ and $h_{R0}(t)$, and how would one design $h_L(t)$ and $h_R(t)$ given $h_{L0}(t)$ and $h_{R0}(t)$.

The Direct Response Part

In each of a left ear and right ear binaural impulse responses, the direct response encodes the level and time differences to the two respective ears which is primarily responsible for the sense of direction imparted to the listener. The inventor found that the spectral effect of the direct head related transfer function (HRTF) part of the binaural filters is not too severe. Furthermore, a typical HRTF also includes a time delay component. That means that when the binauralized outputs are mixed to a monophonic signal, the equivalent filter for the monophonic signal will not be minimum phase and will introduce some additional spectral shaping. The inventor found that these delays are relatively short, e.g., <1 ms. Thus, while the delays do produce some spectral shaping when the outputs of binauralized signals are mixed to a monophonic signal, the inventor found that this spectral shaping is generally not too severe, and any discrete echoes produced by the delay are relatively imperceptible. Therefore, in some embodiments of the invention, the direct portions of the binaural filter impulse response of $h_L(t)$ and $h_R(t)$—those defined by the HRTFs—are the same as for any binaural filter impulse response, e.g., of filters $h_{L0}(t)$ and $h_{R0}(t)$. That is, the characteristics of the binaural filters $h_L(t)$ and $h_R(t)$ that are looked at according to some aspects of the invention exclude the direct part of the impulse responses of the binaural filters.

Note that in some alternate embodiments, this spectral shaping is taken into account. By considering the combined spectra that result at the left and right ears given an excitation across the virtual speaker positions, one embodiment includes a compensating equalization filter to achieve a flatter spectral response. This is often referred to as compensating for the diffuse field head response, and how to carry such filtering would be straightforward to those in the art. Whilst such compensation can remove some of the spectral binaural cues, it does lead to spectral colouration.

In one embodiment, the direct sound response is that for $t<0$. That is, $$h_L(t)=h_{L0}(t) \text{ for } t<3 \text{ ms, and} \quad (10$$

$$h_R(t)=h_{R0}(t) \text{ for } t<3 \text{ ms.} \quad (11)$$

Consider now the original sum and difference filters denoted $h_{S0}(t)$ and $h_{D0}(t)$, respectively, and the sum and difference filters of the binauralizer denoted $h_S(t)$ and $h_D(t)$, respectively. Eqs. (8a) and (9a) and FIG. 4B describe the forward and inverse relationships between the left ear and right ear binauralizer impulse responses and the sum and difference filter impulse responses, namely, that one is a shuffled version of the other. Note again that in a practical implementation of a shuffle operation and reverse shuffle operation, one may not include the $\sqrt{2}$ factor in each operation, but, as one example, simply determine the sum and the difference in one shuffle, and in the shuffle to reverse that operations, divide by two, as described in Eqs. (8b) and (9b).

The inventor found that typical binaural filter impulse responses have a similar signal energy in both the sum and difference filters. The monophonic compatibility constraint identified in Eq. (5) is equivalent to stating that the sum filter has no impulse response, i.e., $h_S(t)=0$ for $t>0$. For embodiments that do not consider the direct part of the response unchanged, the requirement is relaxed to, as shown in Eqs. (10) and (11), that $h_S(t)=0$ for $t>3$ ms or even later.

In order to maintain approximately the same energy in the sum and difference filters, the difference channel should be boosted by about 3 dB compared to the original filter if required to maintain the correct spectrum and ratio of direct to reverberant energy in the modified responses. However, this modification causes an undesirable degradation of the binaural imaging. The sudden change in the interaural cross correlation has a strong perceptual effect, and destroys much of the sense of space and distance.

In one embodiment, $$h_D(t)=h_{D0}(t) \text{ for small values of } t, \text{ say } t<3 \text{ ms, and} \quad (12)$$

$$h_D(t)=\sqrt{2}h_{D0}(t) \text{ for large values of } t, \text{ 2·g., } t>40 \text{ ms.} \quad (13)$$

The binaural filters have a difference filter impulse response that is a 3 dB boost of a typical binaural difference filter impulse response for the direct part of the impulse response, e.g., <3 ms, and have a flat constant value impulse response in the later part of the reverberant part of the difference filter impulse response.

The inventor found that is the change from $h_D(t)=h_{D0}(t)$ to $h_D(t)=h_D(t)=\sqrt{2}h_{D0}(t)$ occurs suddenly, the resulting binaural filters have an undesirable degradation of the binaural imaging compared to the original filters. The sudden change in the interaural cross correlation has a strong perceptual effect, and destroys much of the sense of space and distance.

One aspect of this disclosure is the introducing monophonic compatibility constraint in the later part of the binaural response in a gradual way that is perceptually masked, and thus has minimal impact on the binaural imaging.

The inventor found that typical binaural room impulse responses of a binaural filter pair typically are fairly correlated initially and become uncorrelated in the later part of the response. Furthermore, due to the shorter wavelength, higher frequency parts of the response become uncorrelated earlier in the binaural response. That is, the inventor found that there is a time-dependent phenomenon.

In one embodiment of the invention, the sum filter of the binaural pair is related to a typical sum filter of a typical binaural filter pair by a time-varying filter. Denote the time varying impulse response of the time varying filter by f(t,τ), which is the response of the time varying filter at time t to an impulse at time t=τ, i.e., to input δ(t−τ). That is, $$h_S(t)=\int h_{S0}(t-\tau)f(t,\tau)\cdot d\tau \tag{14}$$

where f(t,τ) is such that $$f(0,\tau)=\delta(\tau) \text{ and} \tag{15}$$

$$f(t,\tau)\approx 0 \text{ for later times, e.g., } t>40 \text{ ms, or } t>80 \text{ ms.} \tag{16}$$

In some embodiments, f(t,τ) is or approximates a zero delay, linear phase, low pass filter impulse response with decreasing time dependent bandwidth denotes by Ω(t)>0, such that the time dependent frequency response, denoted |F(t,ω)| has the property that |F(t,ω)| is flat for low frequencies below the bandwidth, and 0 outside the bandwidth.

$$|F(t,\omega)|\approx 1 \text{ for } |\omega|<\Omega(t)| \tag{17}$$

$$|F(t,\omega)|\approx 0 \text{ for } |\omega|>\Omega(t), \tag{18}$$

where the time varying frequency response is denoted by F(t,ω) with $$F(t,\omega)=\int_{-\infty}^{\infty} f(t,\tau)e^{j\omega\tau}\cdot d\tau, \tag{19}$$

and where the time varying bandwidth is monotonically decreasing in time, i.e., $$\Omega(t_1)>\Omega(t_2) \text{ for } t_1<t_2. \tag{20}$$

One embodiment uses a filter time dependent bandwidth that monotontically increases from at least 20 kHz at t=0 to about 100 Hz or less for high values of time, e.g., for t>10 ms. That is, such that $$\frac{\Omega(0)}{2\pi}>20 \text{ kHz, and} \qquad \frac{\Omega(t)}{2\pi}<100 \text{ Hz for } t>40 \text{ ms} \tag{21}$$

Those in the art will again understand that the form of the filter is expressed in Eqs. (14)-(21) are in continuous time. Describing this in discrete time terms would be relatively straightforward, so will not be discussed herein in order not to distract from describing the inventive features.

With respect to the difference filter, one embodiment uses a difference filter whose impulse response $h_D(t)$ is related to a difference filter whose spatialization is to be matched by $$h_D(t)=\sqrt{2}h_{D0}(t)-(\sqrt{2}-1)\int h_{D0}(t-\tau)\cdot d\tau \tag{22}$$

where $h_{D0}(t)$ denoted the original difference filter impulse response.

Those in the art will again understand that the form of the filter is expressed in Eq. (22) in continuous time. Describing this in discrete time terms would be relatively straightforward, so will not be discussed herein in order not to distract from describing the inventive features.

The filter having the impulse response of Eq. (22) is appropriate where the low pass filter impulse response denoted f(t,τ) has zero delay and linear phase so that the original difference filter $h_{D0}(t)$ whose spatializing qualities to be matched and the difference filter $h_D(t)$ are phase coherent.

Note that because f(0,τ)=δ(τ), $$h_D(0)=h_{D0}(0).$$

Furthermore, because f(t,τ)≈0 for later times, e.g., t>40 ms, $$h_D(t)=\sqrt{2}h_{D0}(t) \text{ for } t>40 \text{ ms or so.}$$

Hence, the difference filter impulse response is, at later times, e.g., after 40 ms, proportional to the difference filter of the to-be-matched or typical binaural filter. Thus, modification to the original difference filter impulse response $h_{D0}(t)$ effects a frequency dependent boost on the difference channel starting at 0 dB at the initial impulse time defined as t=0 and increasing to +3 dB at progressively lower frequencies as time t increases. This gain is appropriate under the assumption that the sum and difference filters will have impulse responses that are similar in magnitude and uncorrelated. Whilst this is not always strictly true, the inventor has found this to be a reasonable assumption, and has found the relationship between the difference channel impulse response $h_D(t)$ and a difference channel impulse response of a binaural filter pair whose spatialization is to be matched a reasonable approach to correct the spectra and direct to reverberant ratio of the modified filters.

The invention, however, is not limited to the relationship shown in Eqs. (14) and (22). In alternate embodiments, other relationships can be used to further improve the spectral match with any provided or determined binaural filter pair, e.g., with impulse responses $h_{L0}(t)$ and $h_{R0}(t)$. This specific approach is presented herein as a relatively simple method to achieve a reasonable result, and is not meant to be limiting.

The target binaural filters can then be reconstructed using the shuffling relationship of Eqs. (8a) and (9a) and FIG. 4B, or of Eqs. (8b) and (9b). This approach has been found to provide an effective balance between reverberation reduction in the monophonic mix down, and perceptually masked impact on the binaural response. The transition to a correlation coefficient of −1 occurs smoothly, and during an initial time interval, e.g., initial 40 ms of the impulse responses. In such an embodiment, the reverberant response in the monophonic mix down is restricted to around 40 ms, with the high frequency reverberation being much shorter.

The 40 ms time is suggested for the monophonic mix down to be almost perceptually anechoic. Although some early reflections and reverberation may still exist in the monophonic mix, this is effectively masked by the direct sound and the inventor has found is not perceived as a discrete echo or additional reverberation.

The invention is not limited to the length 40 ms of the transition region. Such transition region may be altered depending on the application. If it is desired to simulate a room with a particularly long reverberation time, or low direct to reverberation ratio, the transition time could be extended further and still provide an improvement to the monophonic compatibility compared to standard binaural filters for such a room. The 40 ms transition time was found to be suitable for a specific application where the original binaural filters had a reverberation time of 150 ms and the monophonic mix was required to be as close to anechoic as possible.

While in some embodiments, the sum filter is completely eliminated, this is not a requirement. The magnitude of the sum impulse response is reduced by a factor sufficient to achieve a noticeable difference or reduction in the reverberation part of the monophonic mix down. The inventor chose as a criterion the "just noticeable difference" for changes in reverberation level of around 6 dB. Thus in some embodiments, of the invention, a reduction in the sum filter reverberation response of at least 6 dB is used compared to what occurs with a monophonic mix down of signals binauralized with typical binaural filters. Thus, in some embodiments, the sum filter is not completely eliminated, but its influence, e.g., the magnitude of its impulse response is significantly reduced, e.g., by attenuating the sum channel filter impulse response amplitude by 6 dB or more. One embodiment achieves this by combining the original sum filter impulse response and the above proposed modified filter impulse response to determine a sum impulse response denoted $h''_S(t)$ of:

$$h''_S(t)=h_{S0}(t)+(1-\beta)h_S(t). \tag{23}$$

A typical value for β is ½, which weights the original and modified sum filter impulse responses equally. In alternate embodiments, other weighting are used.

It should also be noted that the constraint of f(t,τ) being zero delay and linear phase is for simplicity and appropriate phase reconstruction in the shuffling transformation and modification of the difference channel of Eq. (22). It should be apparent to a practitioner in signal processing that this constraint could be relaxed provided appropriate filtering were also applied to the difference channel to create a relationship between $h_D(t)$ and $h_{D0}(t)$. An observation made by the inventor is that the exact phase relationships and directional cues in the later part of a binaural response are not critical to the general sense of space and distance. Therefore, such filtering may not be strictly necessary. If the goal is to maintain a reverberation ratio in the binaural filters $h_L(t)$, $h_R(t)$ as exist in another binaural filter pair $h_{L0}(t)$, $h_{R0}(t)$, then this can be achieved by an appropriate—in one embodiment frequency dependent—gain to the difference filter impulse response $h_D(t)$.

Figure 6:
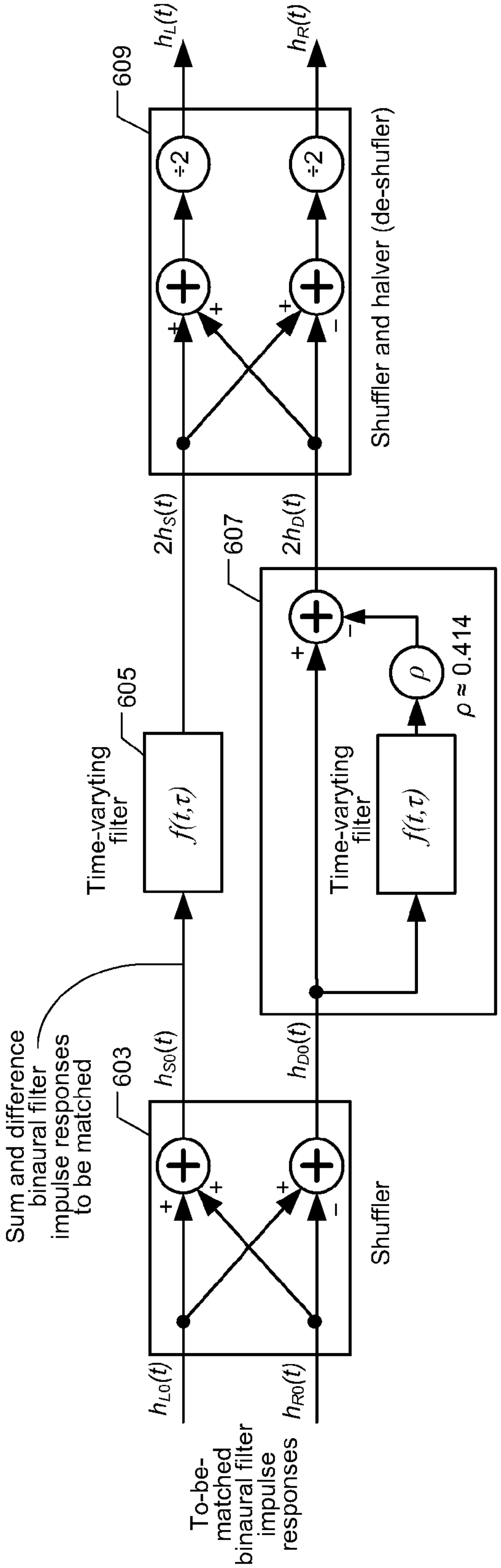
FIG. 6 shows a simplified block diagram of signal processing apparatus embodiment operating on a pair of input signals that are representative of binaural filter impulse responses whose binauralizing properties are to be matched. The processing apparatus is configured to output signals that are representative of binaural filter impulse responses that are able to binauralize and produce a natural sounding monophonic mix, according to one or more aspects of the present invention.
Figure 7:
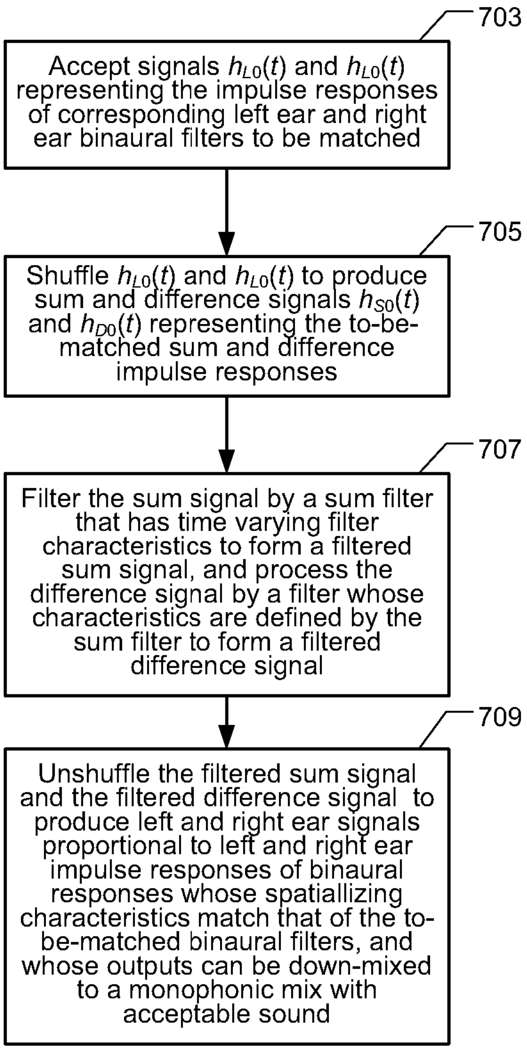
FIG. 7 shows a simplified flowchart of an embodiment of a method of operating a signal processing apparatus such as that of FIG. 6 to generate binaural impulse responses.

FIG. 6 shows a simplified block diagram of signal processing apparatus, and FIG. 7 shows a simplified flowchart of a method of operating a signal processing apparatus. The apparatus is to determine a set of a left ear signal $h_L(t)$ and a right ear signal $h_L(t)$ that form the left ear and right ear impulse responses of a binaural filter pair that approximates the binauralizing of a binaural filter pair that has left ear and right rear impulse responses $h_{L0}(t)$ and $h_{R0}(t)$. The method includes in 703 accepting a left ear signal $h_{L0}(t)$ and right ear signal $h_{R0}(t)$ representing the impulse responses of corresponding left ear and right ear binaural filters configured to binauralize an audio signal and whose binaural response is to be matched. The method further includes in 705 shuffling the left ear signal and right ear signal to form a sum signal proportional to the sum of the left and right ear signals and a difference signal proportional to difference between the left ear signal and the right ear signal. In the apparatus of FIG. 6, this is carried out by shuffler 603. The method further includes in 707 filtering the sum signal by a time varying filter (a sum filter) 605 that has time varying filter characteristics, the filtering forming a filtered sum signal, and processing the difference signal by a different time varying filter 607—a difference filter—that is characterized by the sum filter 605, the processing forming a filtered difference signal. The method further includes in 709 un-shuffling the filtered sum signal and the filtered difference signal to form to produce a left ear signal and a right ear signal proportional respectively to left and right ear impulse responses of binaural filters whose spatializing characteristics match that of the to-be-matched binaural filters, and whose outputs can be down-mixed to a monophonic mix with acceptable sound. In FIG. 6, the de-shuffler 609 is the same as the shuffler 603 with an added divide by 2. The resulting impulse responses define binaural filters configured to binauralize an audio signal and further have the property that the sum channel impulse response decreases smoothly to an imperceptible level, e.g., more than −6 dB in the first 40 ms or so and the difference channel transitions to become proportional to a typical or particular to-be-matched binaural filter difference channel impulse response in the in the first 40 ms or so.

Thus has been described a method of operating a signal processing apparatus. The method includes accepting a pair of signals representing the impulse responses of a corresponding pair of binaural filters configured to binauralize an audio signal. The method includes processing the pair of accepted signals by a pair of filters each characterized by a modifying filter that has time varying filter characteristics, the processing forming a pair of modified signals representing the impulse responses of a corresponding pair of modified binaural filters. The modified binaural filters are configured to binauralize an audio signal and further have the property that of a low perceived reverberation in the monophonic mix down, and minimal impact on the binaural filters over headphones.

The binaural filters according to one or more aspects of the present invention have the properties of:

- The direct part of the impulse responses, e.g., in the initial 3 to 5 ms of the impulse response are defined by the head related transfer functions of the virtual speaker locations.
- Significantly reduced levels and/or significantly shorter reverberation time in the sum filter impulse response compared to the difference filter impulse response.
- Smooth transition from the direct part of the impulse response of the sum filter to the later zero or negligible response part of the sum filter. The smooth transition is frequency selective over time.

These properties would not occur in any practical room response and thus would not be present in typical or to-be-matched binaural filters. These properties are introduced, or designed into a set of binaural filters.

These properties are described in more detail below.

Speaker Compatibility

While the above description describes the binaural filters having monophonic playback compatibility, another aspect of the invention is that the output signals binauralizer with filters according to an embodiment of the invention are also compatible with playback over a set of loudspeakers.

Acoustical cross-talk is the term used to describe the phenomenon that when listening to a stereo pair of loudspeakers, e.g., at approximately center front of a listener, each ear of the listener will receive signal from both of the stereo loudspeakers. With binaural filters according to embodiments of the present invention, the acoustical cross talk causes some cancellation of the lower frequency reverberation. Generally, the later parts of a reverberant response to an input become progressively low pass filtered. Thus, signals binauralized with filters binaural filters according to embodiments of the present invention have been found to sound less reverberant when auditioned over speakers. This is particularly the case small relatively closely spaced stereo speakers, such as may be found in a mobile media device.

Complexity Reduction

It is known to design binaural filters that involve relatively less computation to implement by using the observation that the reverberation part of an impulse response is less sensitive to spatial location. Thus, many binaural processing systems use binaural filters whose impulse responses have a common tail portion for the different simulated virtual speaker positions. See for example, above-mentioned patent publications WO 9914983 and WO 9949574. Embodiments of the present invention are applicable to such binaural processing systems, and to modifying such binaural filters to have monophonic playback compatibility. In particular, binaural filters designed according to some embodiments of the present invention have the property that the late part of the reverberant tails of the left and right ear impulse responses are out of phase, mathematically expressed as $h_R(t) \approx -h_L(t)$ for time t>40 ms or so. Therefore, according to a relatively low computational complexity implementation of the binaural filters, only a single filter impulse response need be determined for the later part of the response, and such determined late part impulse response is usable in each of the left and right ear impulse responses of binaural filter pairs for all virtual speaker locations, leading to savings in memory and computation. The sum filter of each such binaural filter pair includes a gradual time varying frequency cut off which extends the sum filter low frequency content further into the binaural response.

An Example Algorithm and Results

The previous section set out the general properties and approach to achieve the modified binaural filtering. Whilst there are many possible variations of filter design and processing that will have similar result, the following example is presented to demonstrate the desired filter properties, and provide a preferred approach to modifying an existing set of binaural filters.

FIG. 8 shows a portion of code in the syntax of MATLAB (Mathworks, Inc., Natick, Mass.) that carries out part of the method of converting a pair of binaural filter impulse responses to signals representative of impulse responses of binaural filters. The linear phase, zero delay, time varying low pass filter is implemented using a series of concatenated first order filters. This simple approach approximates a Gaussian filter. This brief section of MATLAB code takes a pair of binaural filters h_L0 and h_R0, and creates a set of output binaural filters h_L and h_R. It is based on a sampling rate of 48 kHz.

First, in 803, the input filters are shuffled to create the original sum and difference filter. (see lines 1-2 of the code)

The 3 dB bandwidth of the Gaussian filter (B) is varied with the inverse square of the sample number and appropriate scaling coefficients. From this the associated variance of the Gaussian filter is calculated (GaussVar), and divided by four to obtain the variance of the exponential first order filter (ExponVar). In 805, this is used to calculate the time varying exponential weighting factor (a). (See lines 3-6 of the code).

The filter is implemented in 807 using two forward and two reverse passes of the first order filter. Both the sum and difference responses are filtered. (See lines 7-12 of the code).

In 809, the difference recreated from a scaled up version of the original difference response, less an appropriate amount of the filtered difference response. This is in effect a frequency selective boost of the difference channel from 0 dB at time zero to +3 dB in the later response. (See line 13 of the code).

Finally in 811, the filters are reshuffled to create the modified left and right binaural filters. (See lines 14-15 of the code).

The following figures are obtained from application of the method coded in FIG. 8 to a set of binaural filter impulse responses for a sound positioned in front of the listener, with a 150 ms maximum reverberation time and a ratio of direct to reverberant energies of around 13 dB.

Figure 9:
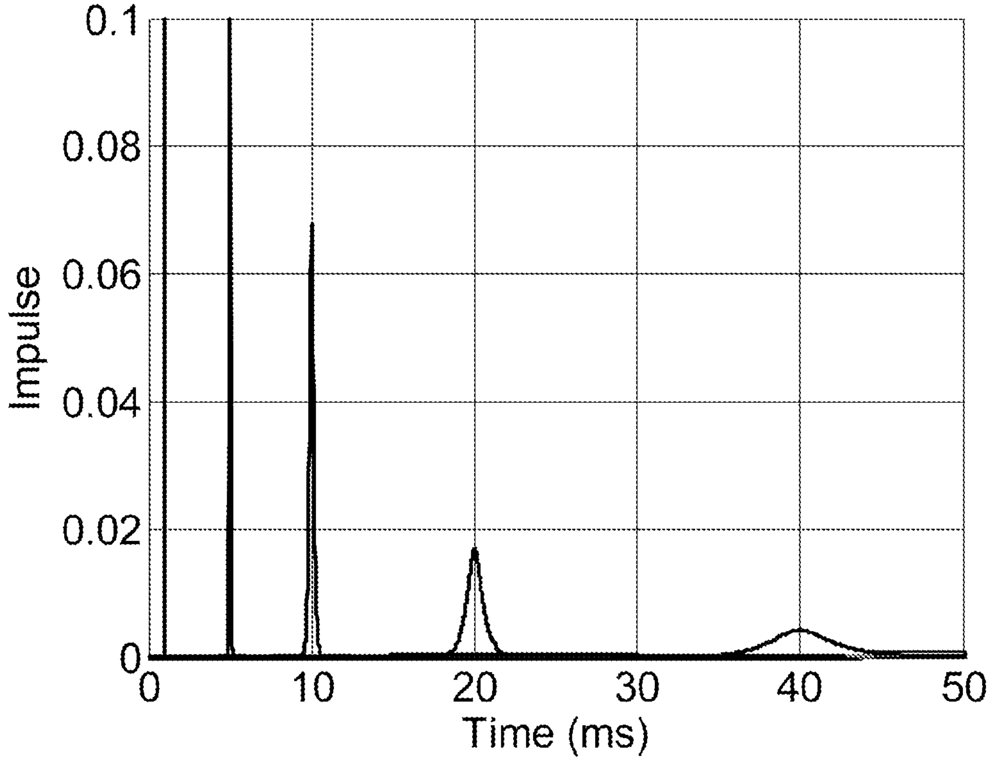
FIG. 9 shows a plot of the impulse response of the time varying filter used in the apparatus embodiment of FIG. 6 and method embodiment of FIG. 7 to an impulse at each of a set of different times.

FIG. 9 shows a plot of the impulse response of the time varying filter $f(t,\tau)$ to an impulses at several times $\tau$: at 1, 5, 10, 20 and 40 ms. The first two impulses are beyond the vertical scale of the figure. FIG. 9 clearly shows the Gaussian approximation of the applied filter impulse response and the increasing variance of the approximately Gaussian filter impulse response with time. Since the first order filter is run both forward and backwards, the resulting filter approximates a zero delay, linear phase, low pass filter.

Figure 10:
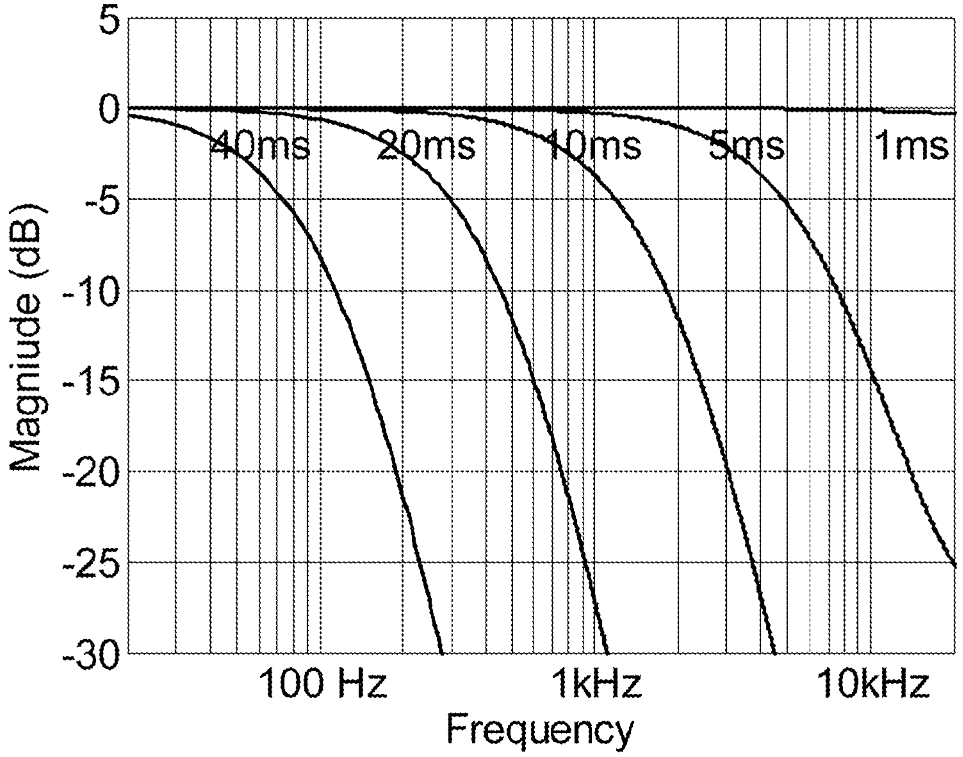
FIG. 10 shows plots of the frequency response magnitude of the time varying filter used in the apparatus embodiment of FIG. 6 method embodiment of FIG. 7 at each of a set of different times.

FIG. 10 shows plots of the frequency response energy of the time varying filter of impulse response $f(t,\tau)$ at times $\tau$ of 1, 5, 10, 20 and 40 ms. It can be seen that the direct part of the response, in this case approximately from 0 to 3 ms, will be largely unaffected by the filter, whilst by 40 ms the filter causes almost 10 dB of attenuation down to 100 Hz. Because of the approximately Gaussian shape of the impulse response, the frequency response also has an approximately Gaussian profile. This approximately Gaussian frequency response profile, and the variation of the cut off frequency over time both help to achieve the perceptual masking of the modification made to the original filter.

Figure 11:
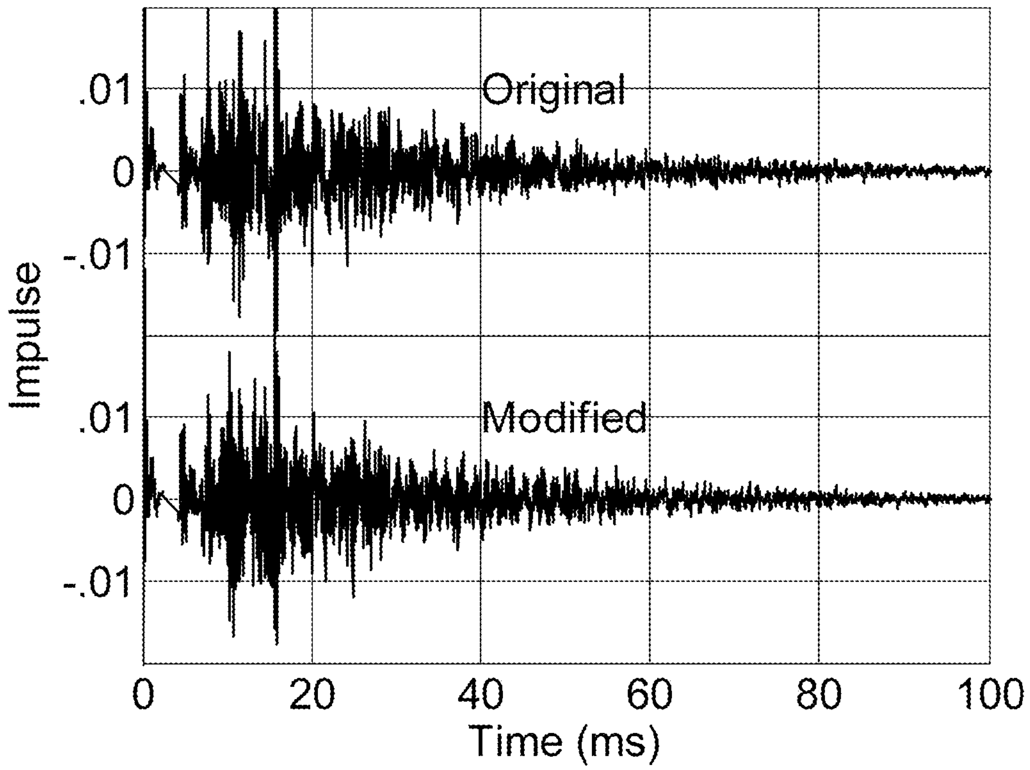
FIG. 11 shows an original left ear binaural filter impulse response and a left ear binaural filter impulse response according to an embodiment of the present invention.

FIG. 11 shows the original left ear impulse response $h_{L0}(t)$ and modified left ear impulse response $h_L(t)$. It is evident that both have a similar level of reverberant energy. The direct sound remains unchanged. Note that the initial impulse of the direct sound measures around 0.2 and cannot be shown on the scale in the figure.

Figure 12:
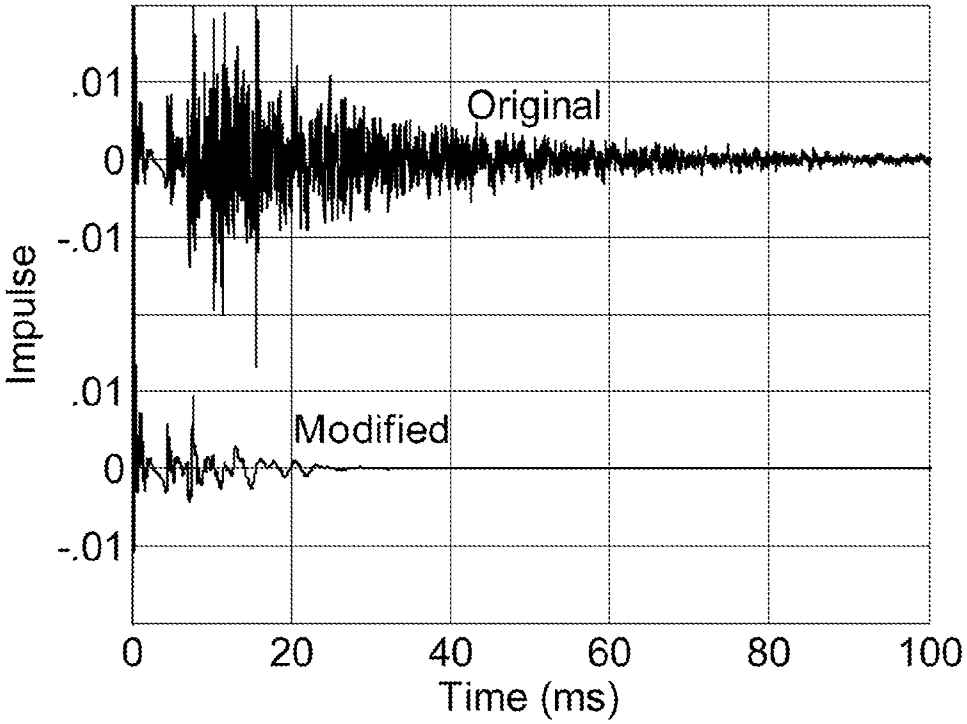
FIG. 12 shows an original binauralizing sum filter impulse response and a binauralizing sum filter impulse response according to an embodiment of the present invention.

FIG. 12 shows a comparison of the original and modified summation impulse responses response $h_{S0}(t)$ and $h_S(t)$. This clearly demonstrates the reduced level and reverberation time of the summation response. This is the characteristic that achieves a significant reduction in the reverberation when the output is mixed down to monophonic. It can also be seen that the modified summation response $h_S(t)$ becomes progressively low pass filtered, with only the lowest frequency signal components extending beyond the early part of the response.

Figure 13:
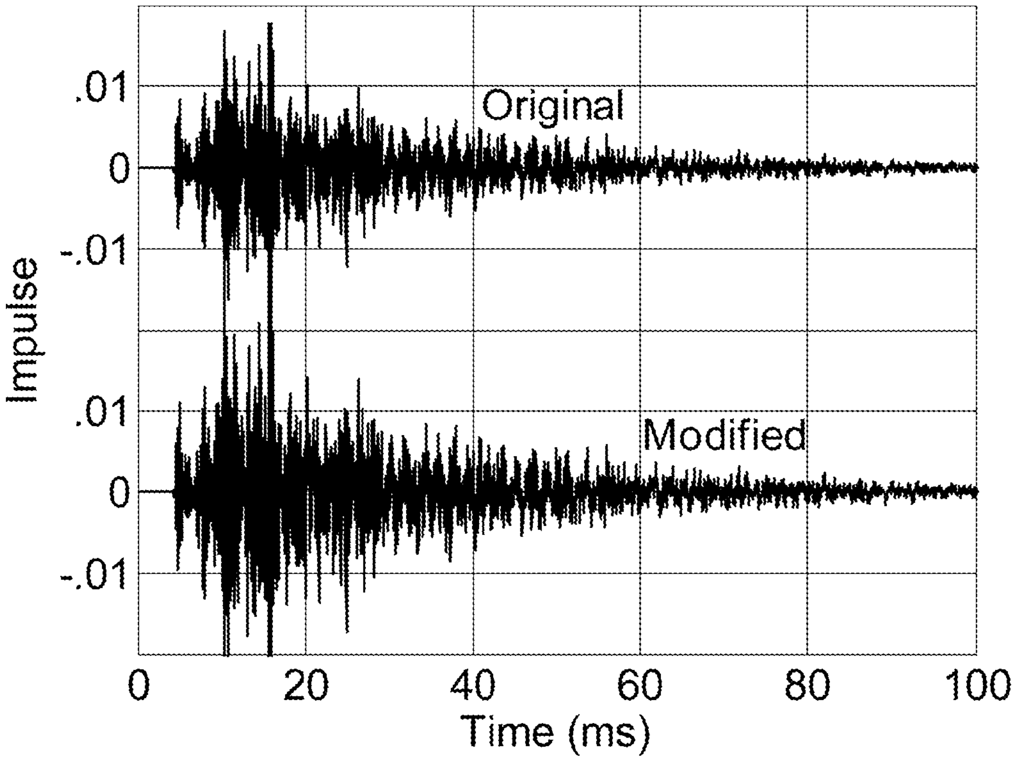
FIG. 13 shows an original binauralizing difference filter impulse response and a binauralizing difference filter impulse response according to an embodiment of the present invention.

FIG. 13 shows the original and modified difference impulse responses $h_{D0}(t)$ and $h_D(t)$. It can be observed that the difference signal is boosted in level. This is to achieve comparable spectra of the two responses.

Time Frequency Analysis of the Binaural Filters

The binaural filters, e.g., as characterized by a pair of binaural impulse response in according to one or more aspects of the invention, when used to filter a source signal, e.g., by convolving with the binaural impulse response or otherwise applied to a source signal, add a spatial quality that simulates direction, distance and room acoustics to a listener listening via headphones.

Time-frequency analysis, e.g., using the short time Fourier transform or other short time transform on sections signals that may overlap is well known in the art. For example, frequency-time analysis plots are known as spectrograms. A short time Fourier transform, e.g., in typically implemented as a windowed discrete Fourier transform (DFT) over a segment of a desired signal. Other transforms also may be used for time-frequency analysis, e.g., wavelet transforms and other transforms. An impulse response is a time signal, and hence may be characterized by its time-frequency properties. The inventive binaural filters may be described by such time-frequency characteristics.

The binaural filters according to one or more aspects of the present invention are configured to achieve simultaneously a convincing binaural effect over headphones, e.g., according to a pair of to-be-matched binaural filters, and a monophonic playback compatible signal when mixed down to a single output. Binaural filter embodiments of the invention are configured to have the property that the (short time) frequency response of the binaural filter impulse responses varies over time with one or more features. Specifically, the sum filter impulse response, e.g., the arithmetic sum of the two left and right binaural filter impulse responses, has a pattern over time and frequency that differs significantly from the difference filter impulse response, e.g., the arithmetic difference of the left and right binaural filter impulse responses. For a typical binaural response, the sum and difference filters show a very similar variation in frequency response over time. The early part of the response contains the majority of the energy, and the later response contains the reverberant or diffuse component. It is the balance between the early and late parts, and the characteristic structure of the filters that imparts the spatial or binaural characteristics of the impulse response. However, when mixed down to mono, this reverberant response usually degrades the signal intelligibility and perceived quality.

By simple compatibility is meant that Eq. (5) holds. That is, other than for the initial impulse or tap of the filter impulse response, $h_R(t)=-h_L(t)$ for $t>0$, i.e., that $h_S(t)=0$ for $t>0$. The resulting filter set is called simplistic monophonic playback compatible filter set, or simplistic filter.

In this section are describes some characteristics of time-frequency analysis of such the impulse responses of inventive binaural filter pairs, and provides some typical values and range of values for some time-frequency parameters. This is demonstrated by example data and comparisons to: 1) a set of to-be-matched, e.g., typical binaural filters, and 2) a filter set derived from the typical binaural filters by imposing simple compatibility to obtain a simplistic monophonic compatibility filter set.

FIGS. 14A-14E show plots of the energy as a function of frequency in the sum and difference filter responses at varying time spans along the length of the filter. While arbitrary, the inventor selected the time slices of 0-5 ms, 10-15 ms, 20-25 ms, 40-45 ms and 80-85 ms for this description. The 5 ms span of each section is to maintain a consistent length for comparative power levels, and it is also sufficient to capture some of the echoes and details in the filters, which can be sparse over time. FIGS. 14A-14E show the frequency spectra for 5 ms segments at these times for a typical pair, for a simplistic monophonic compatibility pair, and for new binaural filter pair according to one or more aspects of the invention. To determine these plots, the impulse responses of simplistic monophonic compatibility pair were determined from the typical (to-be-matched pair). Furthermore, the impulse responses of the filters that include features of the present invention were determined from the typical (to-be-matched pair) according to the method described hereinabove. The frequency energy response was calculated using the short time Fourier transform as a short-time windows DFT. No overlap was used for determine the five sets of frequency responses.

Note that the filters shown could easily be scaled by an arbitrary amount, so that the values expressed in these plots are to be interpreted in a relative and quantitative sense. Of interest are not the actual levels, but rather the times at which particular parts of the spectra of the respective difference filter impulse responses become negligible when compared with the respective sum filter impulse response.

Figure 14A:
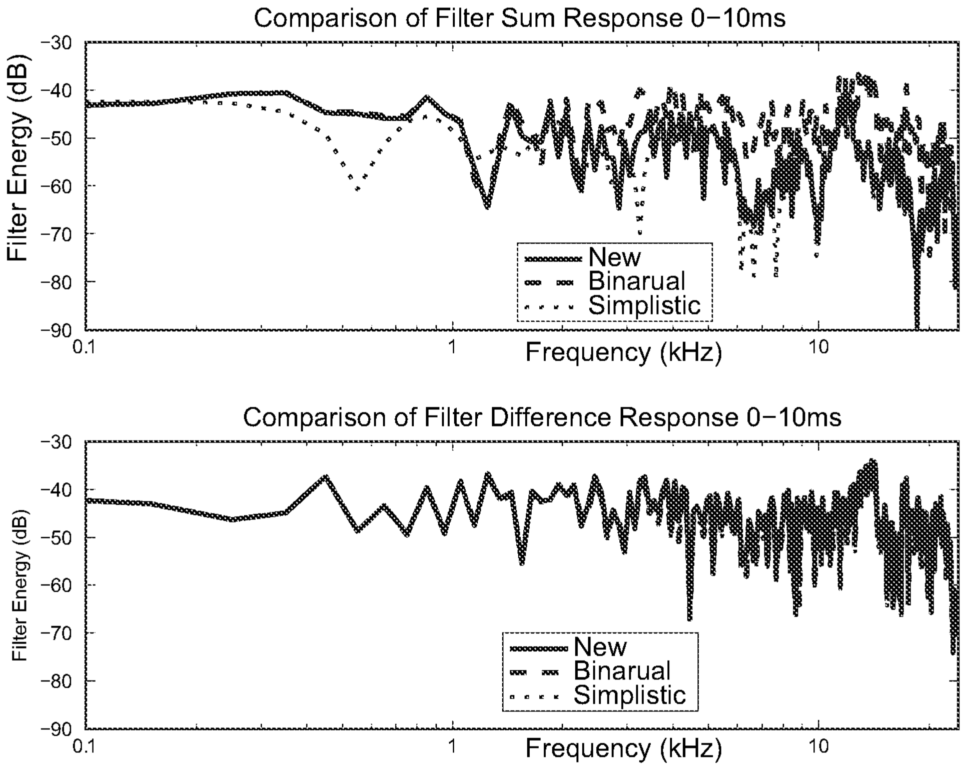
FIGS. 14A-14E show plots of the energy as a function of frequency in the sum and difference filter responses over varying time spans along the length of the filter impulse responses of an example binaural filter pair embodiment of the present invention.

FIG. 14A, for the first 5 ms starting at time 0 ms, it can be seen that the three responses are almost identical. This is the very early part of the response that is based on the HRTF from a virtual speaker location to impart a sense of direction. Any spread of the signal or echoes in the filter in this time are largely perceptually ignored due to the masking effect and dominant initial impulse.

Figure 14B:
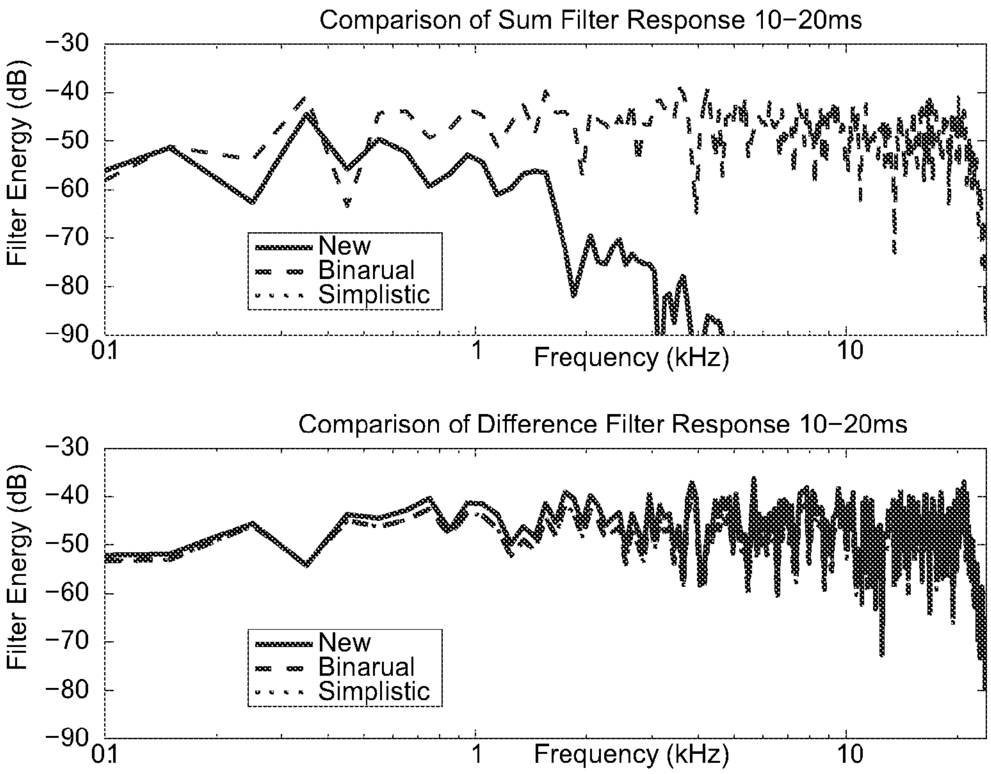

In FIG. 14B, for the 5 ms starting at time at time 10 ms, the sum signal for the simplistic approach is zero. The later part of the sum response has been eliminated. In comparison, the novel filter pair, e.g., determined described hereinabove still maintains some signal energy in the sum filter below 4 kHz. The difference response of all three filters is similar, with the novel filter pair difference impulse response having slightly more energy at higher frequencies.

Figure 14C:
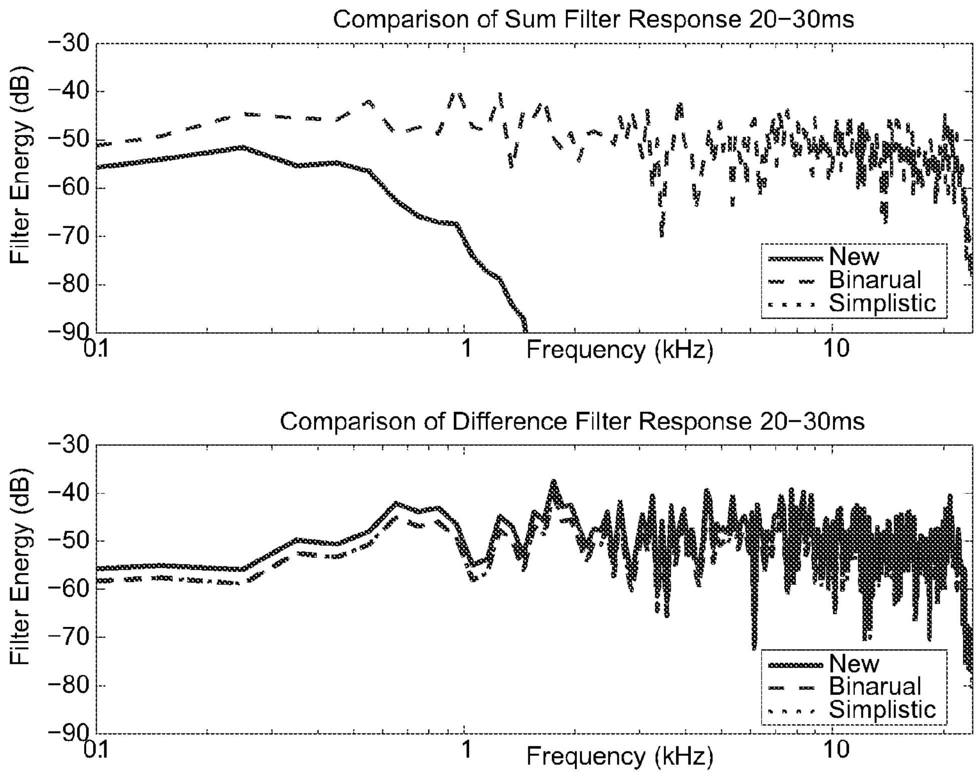

In FIG. 14C, for the 5 ms starting at time 20 ms, the sum filter of the novel filter pair is further attenuated with the bandwidth coming down to around 1 kHz. The difference filter of the novel filter pair is boosted to maintain a similar binaural level and frequency response overall to that of a typical or to-be-matched filter pair.

Figure 14D:
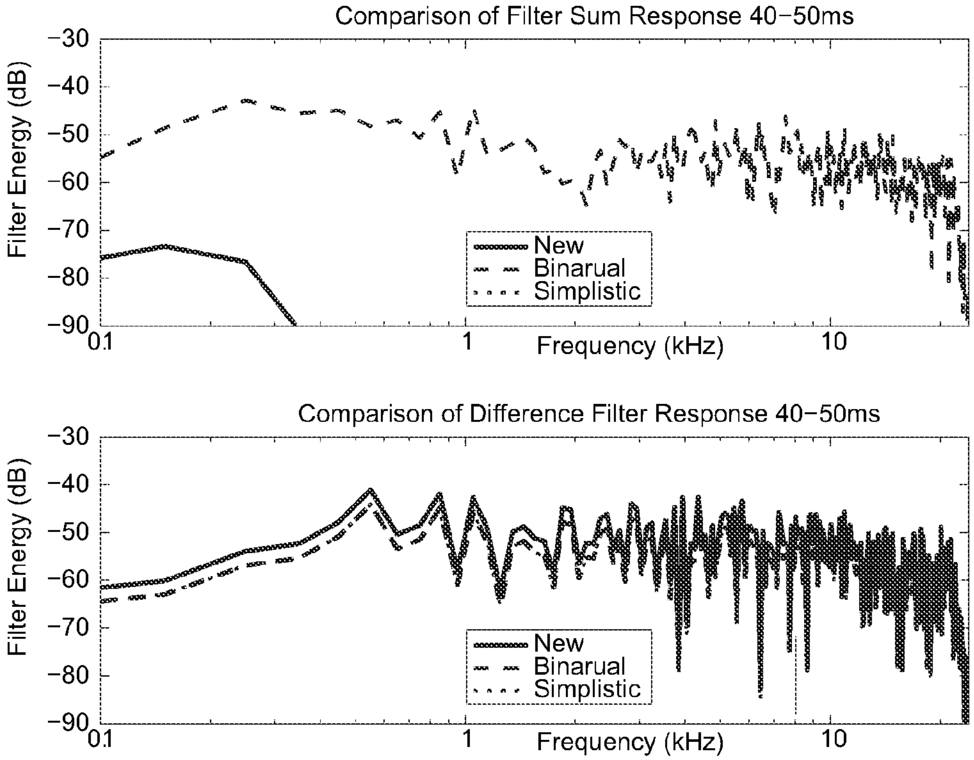
Figure 14E:
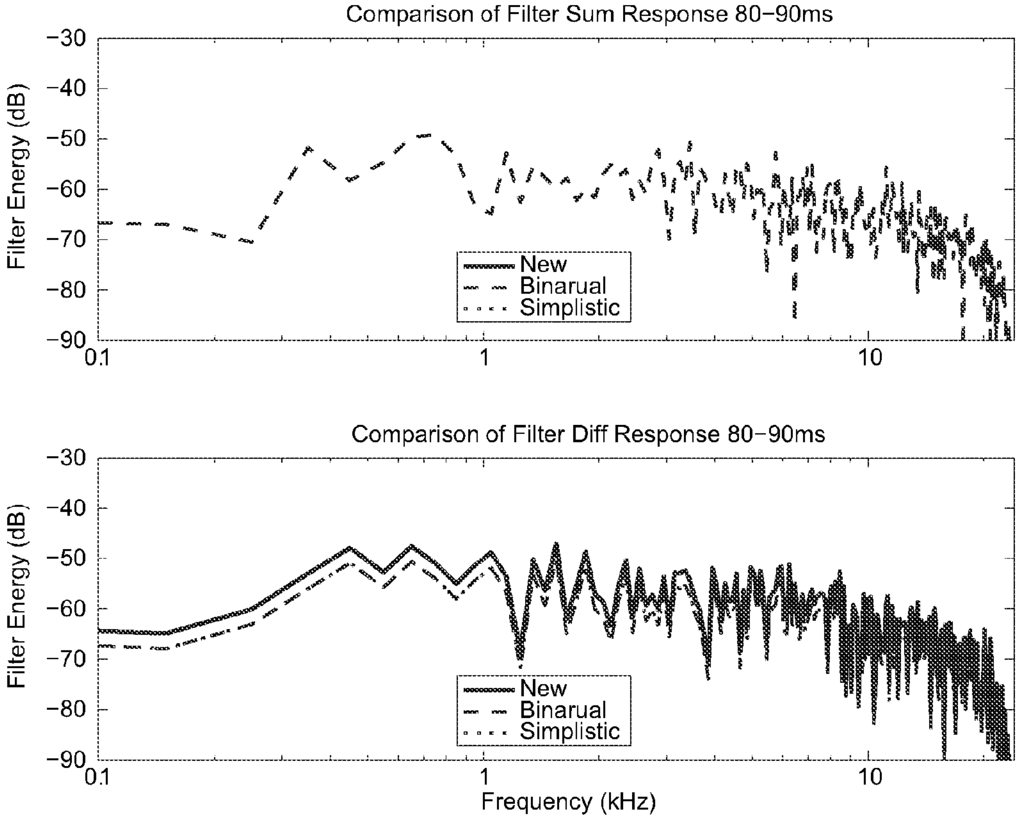

In FIG. 14D, for the 5 ms starting at 40 ms, only the lowest components of the sum filter novel filter pair remains. Finally in FIG. 14E, for the 5 ms starting at 80 ms, the sum filter impulse response in both the simplistic and novel filter pair is negligible.

Thus, a set of binaural filters is proposed with a shaping of the binaural filter impulse responses configured to achieve very good monophonic playback compatibility. In some embodiments, the filters are configured such that the monophonic response is constrained to the first 40 ms.

The following properties relate to the effectiveness of the filters for achieving both good binaural response and good monophonic playback compatibility. In these, by "filter extent" and "filter length" is the point at which the impulse response of the filter falls below −60 dB of its initial value. This is also known in the art as the "reverberation time."

The following properties allow one to distinguish the inventive filters described herein from other binaural filters and monophonic-playback compatible binaural filters.

- The sum and difference filters are substantially different. For general binaural filters, the sum and difference filters show similar characteristics of intensity and decay across the time frequency plot.
- The sum filter is significantly shorter than the difference filter at all frequencies. Whilst the sum filter will typically be slightly shorter in duration for typical listening rooms, this is not that significant. For mono compatibility, the sum filter must be substantially shorter.
- Sum filter shows a significant difference in length across different frequencies. This is in comparison to the simplistic approach where the sum filter is reasonably constant in length across frequencies.
- The sum filter is shorter at high frequencies and longer at low frequencies.

Note that a similar shaping could be achieved in which the suppression of the summation channel was more aggressive (better mono response), or more conservative (better binaural response).

In more quantitative terms, to achieve a good combination of binaural response and monophonic playback compatibility, the following were found to be true:

Difference Filter

- The high frequencies, e.g., above 10 kHz of the difference filter do not extend beyond about 10 ms. In another example embodiment, a difference filter length of about 20 ms was still acceptable, while a filter length of about 40 ms, a monophonic signal starts to sound echoey.
- The low frequencies, e.g., between 3 kHz and 4 kHz of the difference filter are longer, extending out to about 40 ms or around ⅛ to ¼ of the reverberation length of the difference filter at that frequency.
- At even lower frequencies, say below 2 kHz, the difference filter should be no longer than about 80 ms at the lowest frequencies for a very good response. In some embodiments, a length of even 120 ms sounded acceptable, while with a filter length of about 160 ms for less than 2 kHz, a monophonic signal starts to sound echoey.

Furthermore for good binaural response with this constrained difference filter, the overall extent, e.g., the reverberation of the difference filter should not be too long. The inventor has found that a reverberation time of 200 ms produces excellent results, 400 ms produces acceptable results, while the audio starts to sound problematic with a filter length of 800 ms.

Sum Filter

Table 1 provides a set of typical values for the sum filter impulse response lengths for different frequency bands, and also a range of values of the sum filter impulse response length for the frequency bands which still would provide a balance between monophonic playback compatibility and listening room spatialization.

TABLE 1

| Frequency band (bandwidth) | Typical sum filter length | Range of sum filter lengths |
|---|---|---|
| 0-100 Hz | 80 ms | 40-160 ms |
| 100-1 kHz | 40 ms | 20-80 ms |
| 1-2 kHz | 20 ms | 10-40 ms |
| 2-20 kHz | 10 ms | 5-20 ms |

Choosing the time dependent frequency shaping depends on the nature and reverberance of the desired binaural response, e.g., as characterized by a set of to-be-matched binaural filters $h_{LO}(t)$ and $h_{RO}(t)$ as described hereinabove, and also on the preference for clarity in the monophonic mix against the approximation or constraint in the binaural filters.

Figure 15A:
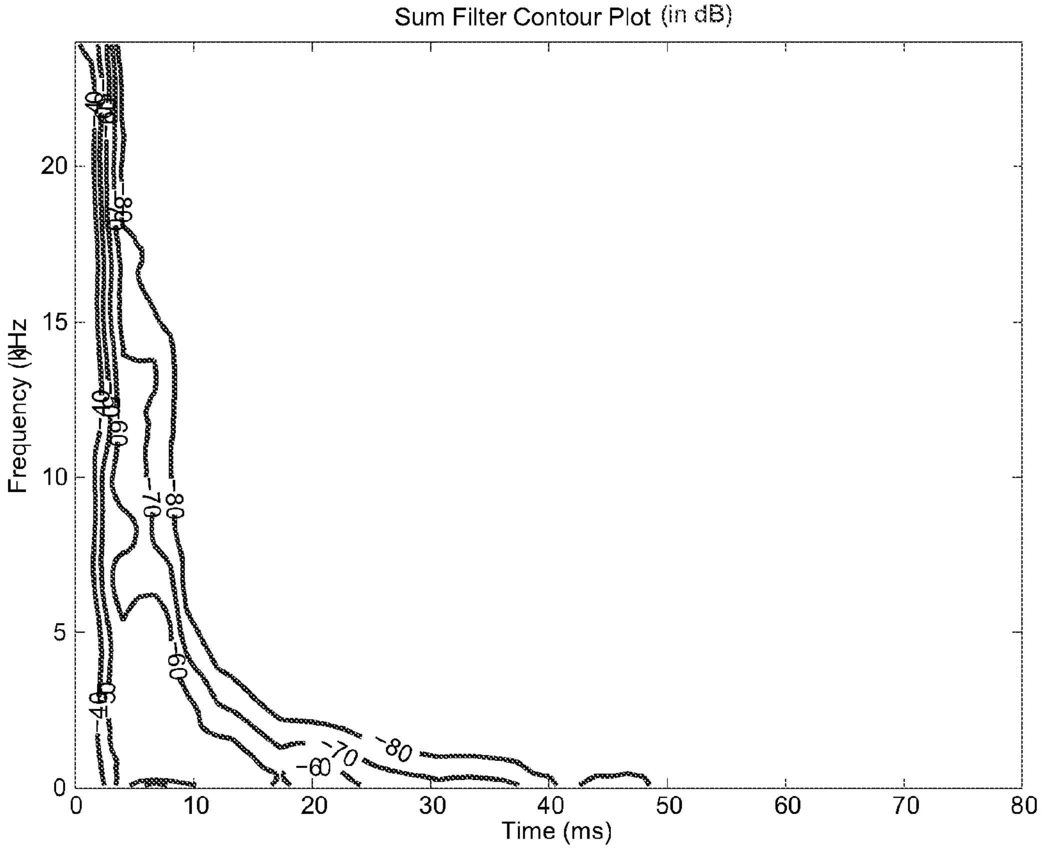
FIGS. 15A and 15B show equal attenuation contours on the time-frequency plane for the sum and frequency filter impulse responses, respectively of an example binaural filter pair embodiment of the present invention.
Figure 15B:
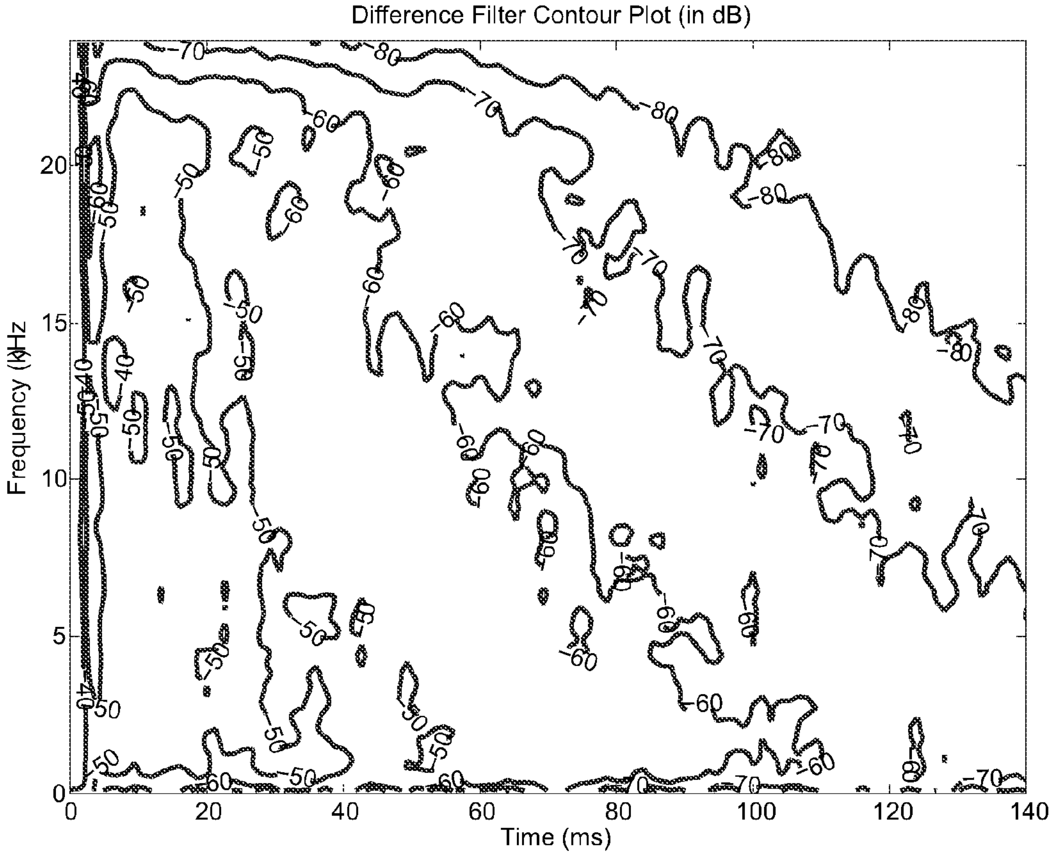
Figure 16A:
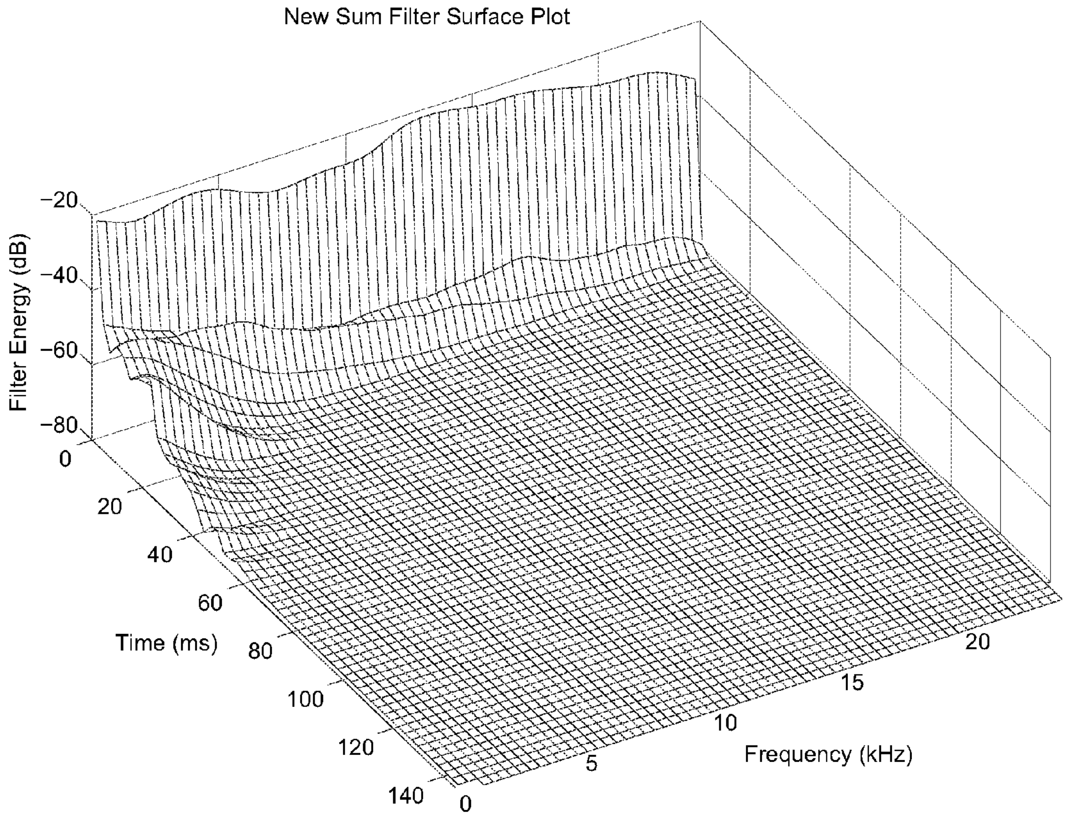
FIGS. 16A and 16B show isometric views of the surface of the time-frequency plots, i.e., spectrograms for the sum and frequency filter impulse responses, respectively of an example binaural filter pair embodiment of the present invention.
Figure 16B:
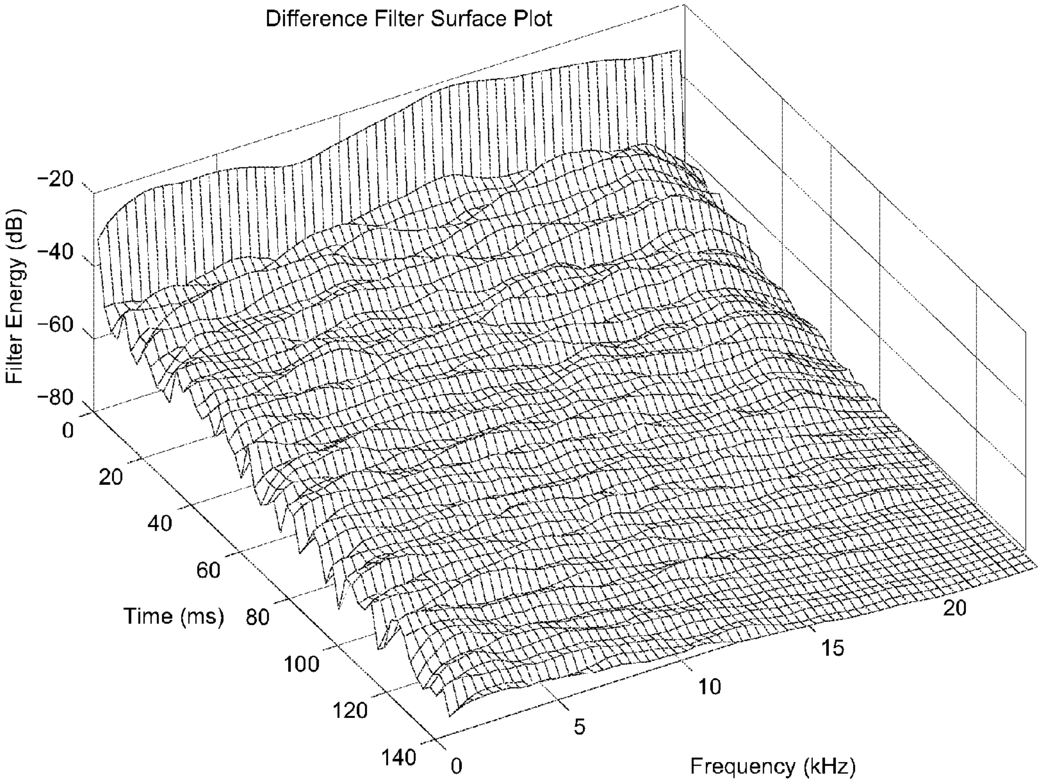
Figure 17A:
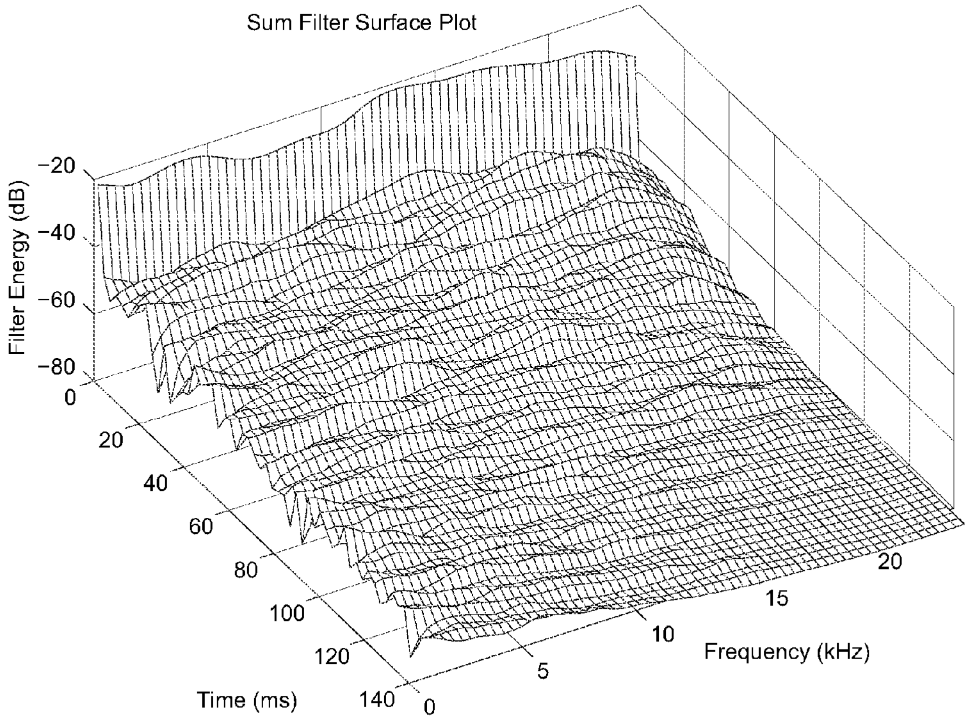
FIGS. 17A and 17B show the same isometric views of the surface of the time-frequency plots as FIGS. 16A and 16B, but for the sum and frequency filter impulse responses, respectively of a typical binaural filter pair, in particular, the binaural filters that those used for FIGS. 16A and 16B are to match.
Figure 17B:
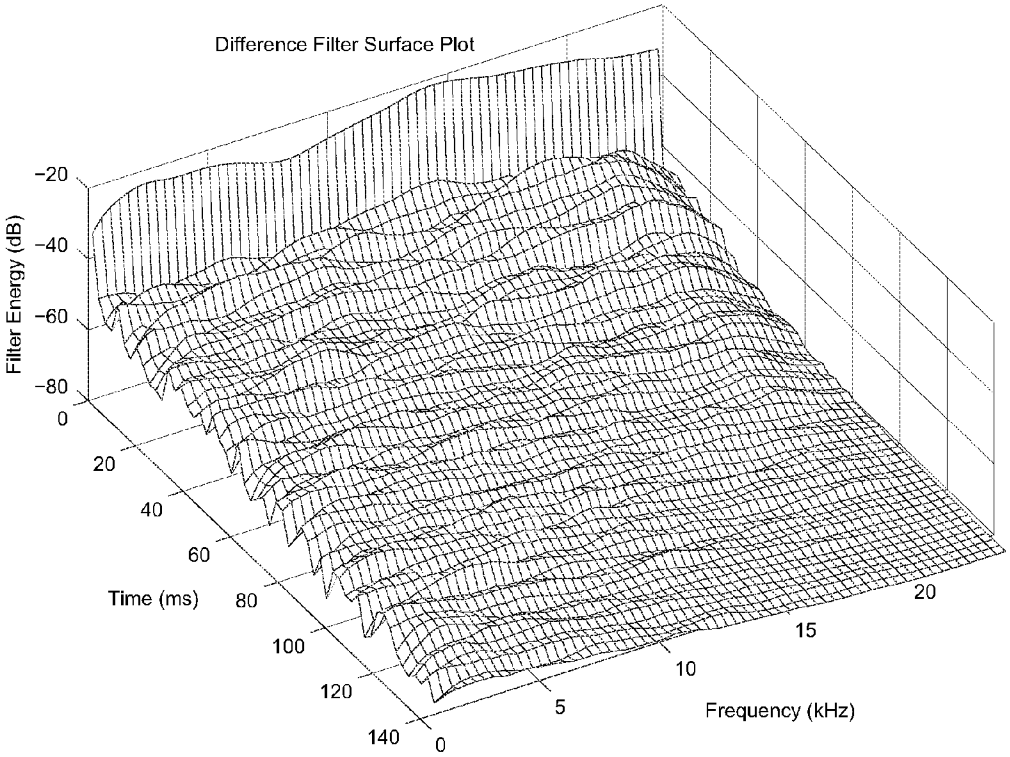

To facilitate the description of the shaping of the sum filter indicated by this invention, the example data is now presented as plots of the relative filter energy over the two dimensional map of time and frequency. FIGS. 15A and 15B show equal attenuation contours on the time-frequency plane for the sum and frequency filter impulse responses, respectively of an example binaural filter pair embodiment, while FIGS. 16A and 16B show isometric views of the surface of the time-frequency plots, i.e., of spectrograms. The contour data was obtained by using the windowed short time Fourier transform on 5 ms long segments that start 1.5 ms apart, i.e., that have significant overlap. The isometric views used a 3 ms window length, with no overlap, i.e., data starting every 3 ms. FIGS. 17A and 17B show the same isometric views of the surface of the time-frequency plots as FIGS. 16A and 16B, but for the sum and frequency filter impulse responses, respectively of a typical binaural filter pair, in particular, the binaural filters that those used for FIGS. 16A and 16B are to match. Note that in a typical binaural filter pair, the shape of the time-frequency plots of the sum and difference filters' respective impulse responses are not that different.

Note that simplistic monophonic compatibility filter pair would show a sum filter impulse whose response immediately and suddenly drops to below perceptible level for all frequencies.

Note that some smoothing of the time-frequency data was carried out to generate FIGS. 15A, 15B, 16A, 16B, 17A, and 17B in order to simplify the drawings so as not to obscure features of the time-frequency characteristics with small-detail variations in the respective responses.

It should be noted that the dB levels shown in all the plots and graphs presented herein are only on a relative scale and thus are not absolute characteristics of the filters and patterns being described. One skilled in the art would be able to interpret these drawings and the characteristics they describe without needing to keep to exactly to the detailed levels, times and spectral shapes.

Testing

The inventor ran subjective tests with several types of source materials with the shaping defined in the "Typical sum filter length" column of Table 1 above and to-be-matched binaural impulse responses response given as the examples of FIGS. 14A-14E. The to-be-matched impulse response has a binaural response with a 200-300 ms reverberation time, and corresponds to DOLBY HEADPHONE DH3 binaural filters. There were no statistical significant cases in which the subjects preferred one binaural response over the other in the test. However the monophonic mix was substantially improved and unanimously preferred by all subjects for all source material tested.

Playback Through Speakers

The methods and apparatuses described above using binaural filters are not only applicable for binaural headphone playback, but may be applied to stereo speaker playback. When loudspeakers are close together, there is crosstalk between the left and right ear of a listener during listening, e.g., crosstalk between the output of a speaker and the ear furthest from the speaker. For example, for a stereo pair of speakers placed in front of a listener, crosstalk refers to the left ear hearing sound from the right speaker, and also to the right ear hearing sound from the left speaker. When the speakers are sufficiently close compared to the distance between the speakers and the listener, the crosstalk essentially causes the listener to hear the sum of the two speaker outputs. This is essentially the same as monophonic playback.

Implementing the Filters

Furthermore, those in the art will understand that the digital filters may be implemented by many methods. For example, the digital filters may be carried out by finite impulse response (FIR) implementations, implementations in the frequency domain, overlap transform methods, and so forth. Many such methods are known, and how to apply them to the implementations described herein would be straightforward to those in the art.

Note that it will be understood by those skilled in the art that the above filter descriptions do not illustrate all required components, such as audio amplifiers, and other similar elements, and one skilled in the art would know to add such elements without further teaching. Further, the above implementations are for digital filtering. Therefore, for analog inputs, analog to digital converters will be understood by those in the art to be included. Further, digital-to-analog (D/A) converters will be understood to be used to convert the digital signal outputs to analog outputs for playback through headphones, or in the transaural filtering case, through loudspeakers.

Figure 18:
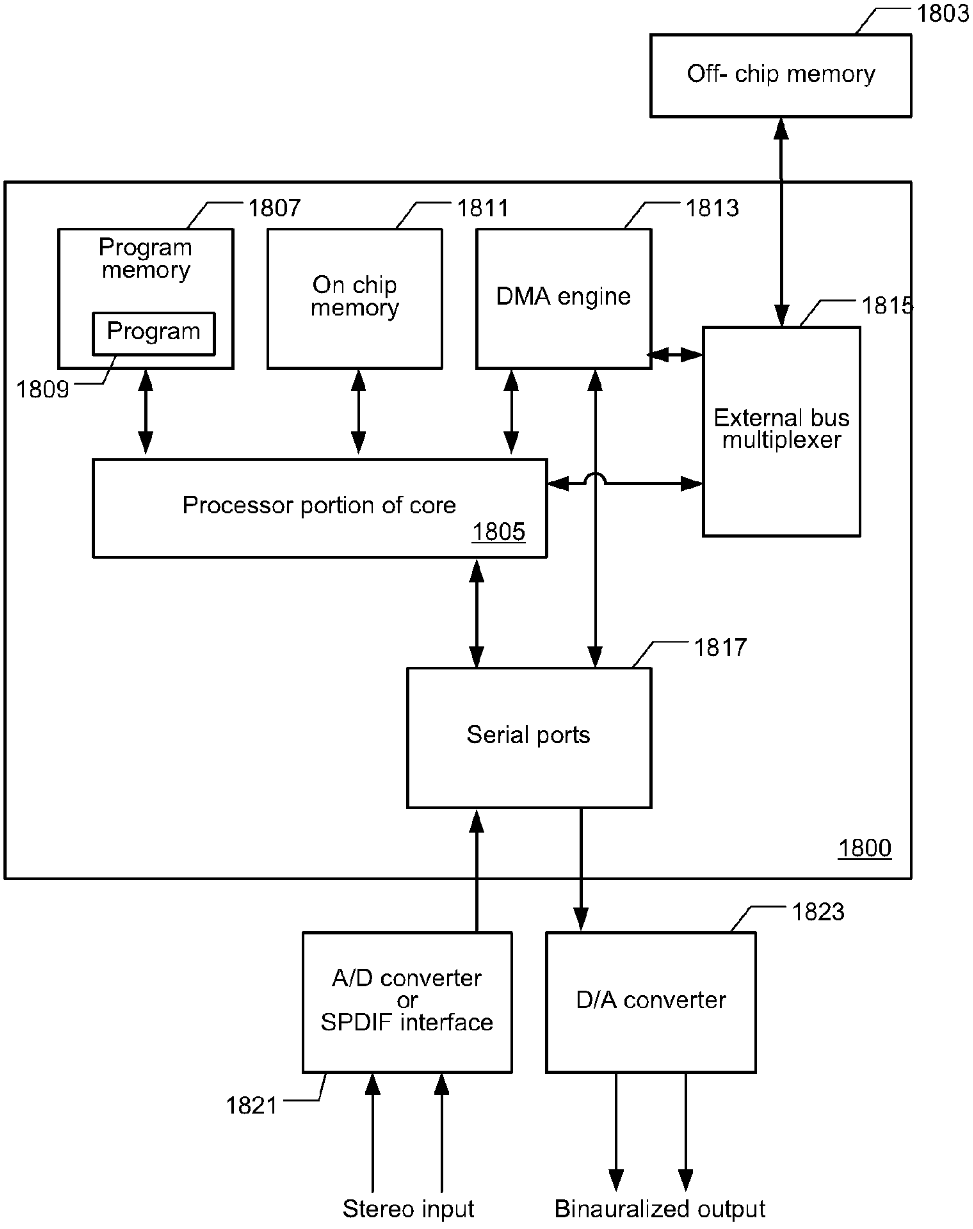
FIG. 18 shows a form of implementation of an audio processing apparatus configured to process a set of audio input signals according to aspects of the invention.

FIG. 18 shows a form of implementation of an audio processing apparatus for processing a set of audio input signals according to aspects of the invention. The audio processing system includes: an input interface block 1821 that include an analog-to-digital (A/D) converter configured to convert analog input signals to corresponding digital signals, and an output block 1823 with a digital to analog (D/A) converter to convert the processed signals to analog output signals. In an alternate embodiment, the input block 1821 also or instead of the A/D converter includes a SPDIF (Sony/Philips Digital Interconnect Format) interface configured to accept digital input signals in addition to or rather than analog input signals. The apparatus includes a digital signal processor (DSP) device 1800 capable of processing the input to generate the output sufficiently fast. In one embodiment, the DSP device includes interface circuitry in the form of serial ports 1817 configured to communicate the A/D and D/A converters information without processor overhead, and, in one embodiment, an off-device memory 1803 and a DMA engine 1813 that can copy data from the off-chip memory 1803 to an on-chip memory 1811 without interfering with the operation of the input/output processing. In some embodiments, the program code for implementing aspects of the invention described herein may be in the off-chip memory 1803 and be loaded to the on-chip memory 1811 as required. The DSP apparatus shown includes a program memory 1807 including program code 1809 that cause a processor portion 1805 of the DSP apparatus to implement the filtering described herein. An external bus multiplexor 1815 is included for the case that external memory 1803 is required.

Note that the term off-chip and on-chip should not be interpreted to imply the there is more than one chip shown. In modern applications, the DSP device 1800 block shown may be provided as a "core" to be included in a chip together with other circuitry. Furthermore, those in the art would understand that the apparatus shown in FIG. 18 is purely an example.

Figure 19A:
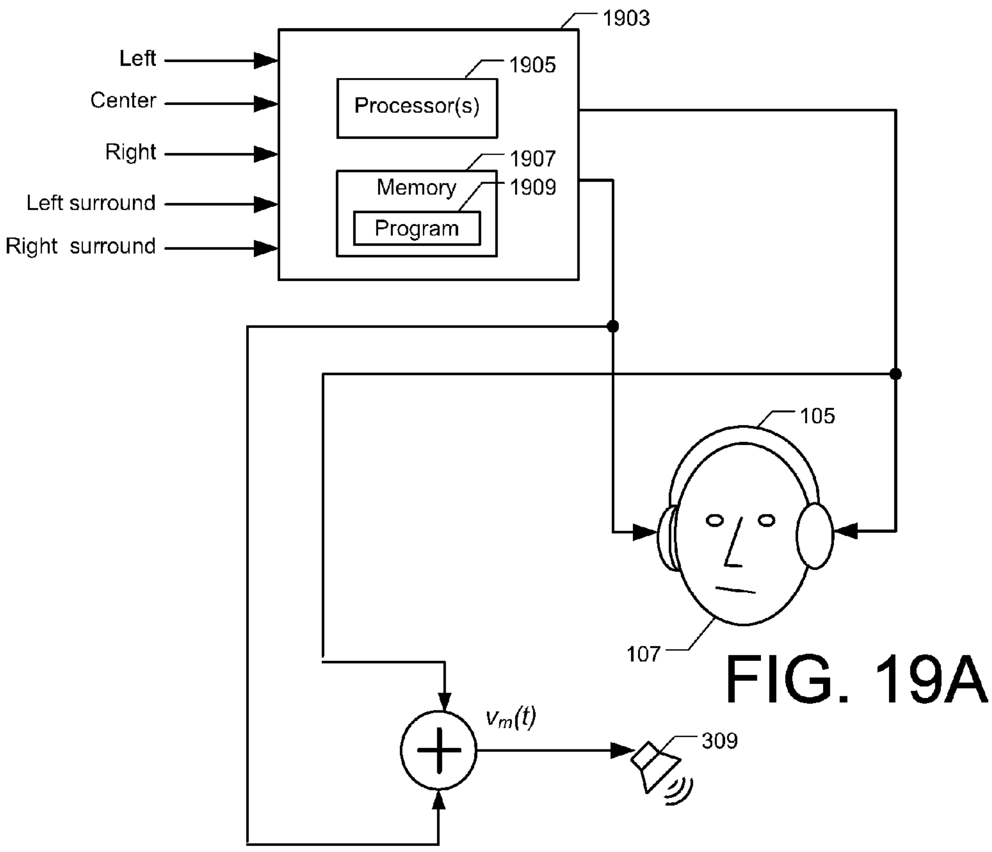
FIG. 19A shows a simplified block diagram of an embodiment of a binauralizing apparatus that accepts five channels of audio information.

Similarly, FIG. 19A shows a simplified block diagram of an embodiment of a binauralizing apparatus that is configured to accept five channels of audio information in the form of a left, center and right signals aimed at playback through front speakers, and a left surround and right surround signals aimed at playback via rear speakers. The binauralizer implements binaural filter pairs for each input, including, for the left surround and right surround signals, aspects of the invention so that a listener listening through headphones experiences spatial content while a listener listening to a monophonic mix experiences the signals in a pleasing manner as if from a monophonic source. The binauralizer is implemented using a processing system 1903, e.g., one including a DSP device that includes at least one processor 1905. A memory 1907 is included for holding program code in the form of instructions, and further can hold any needed parameters. When executed, the program code cause the processing system 1903 to execute filtering as described hereinabove.

Figure 19B:
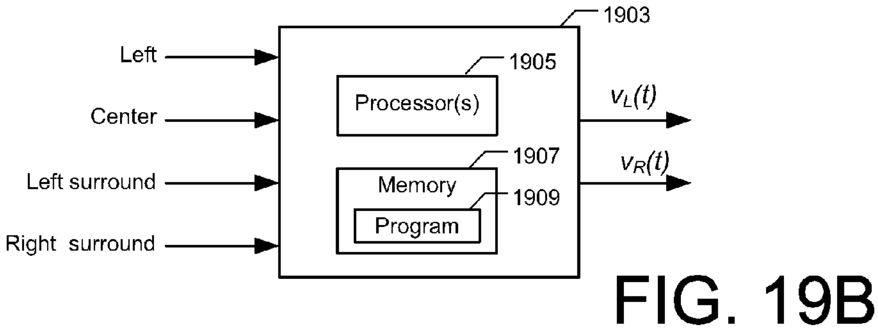
FIG. 19B shows a simplified block diagram of an embodiment a binauralizing apparatus that accepts four channels of audio information.

Similarly, FIG. 19B shows a simplified block diagram of an embodiment of a binauralizing apparatus that accepts four channels of audio information in the form of a left and right from signals aimed at playback through front speakers, and a left rear and right rear signals aimed at playback via rear speakers. The binauralizer implements binaural filter pairs for each input, including for left and right signals, and for the left rear and right rear signals, aspects of the invention so that a listener listening through headphones experiences spatial content while a listener listening to a monophonic mix experiences the signals in a pleasing manner as if from a monophonic source. The binauralizer is implemented using a processing system 1903, e.g., including a DSP device that has a processor 1905. A memory 1907 is included for holding program code 1909 in the form of instructions, and further can hold any needed parameters. When executed, the program code cause the processing system 1903 to execute filtering as described hereinabove.

In one embodiment, a computer-readable medium is configured with program logic, e.g., a set of instructions that when executed by at least one processor, causes carrying out a set of method steps of methods described herein.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include at least one processor.

Note that when a method is described that includes several elements, e.g., several steps, no ordering of such elements, e.g., ordering of steps is implied, unless specifically stated.

The methodologies described herein are, in one embodiment, performable by one or more processors that accept computer-executable (also called machine-executable) program logic embodied on one or more computer-readable media. The program logic includes a set of instructions that when executed by one or more of the processors carry out at least one of the methods described herein. Any processor capable of executing a set of instructions (sequential or otherwise) that specify actions to be taken are included. Thus, one example is a typical processing system that includes one processor or more than processors. Each processor may include one or more of a CPU, a graphics processing unit, and a programmable DSP unit. The processing system further may include a storage subsystem that includes a memory subsystem including main RAM and/or a static RAM, and/or ROM. The storage subsystem may further include one or more other storage devices. A bus subsystem may be included for communicating between the components. The processing system further may be a distributed processing system with processors coupled by a network. If the processing system requires a display, such a display may be included, e.g., a liquid crystal display (LCD), organic light emitting display, plasma display, a cathode ray tube (CRT) display, and so forth. If manual data entry is required, the processing system also includes an input device such as one or more of an alphanumeric input unit such as a keyboard, a pointing control device such as a mouse, and so forth. The terms storage device, storage subsystem, etc., unit as used herein, if clear from the context and unless explicitly stated otherwise, also encompasses a storage device such as a disk drive unit. The processing system in some configurations may include a sound output device, and a network interface device. The storage subsystem thus includes a computer-readable medium that carries program logic (e.g., software) including a set of instructions to cause performing, when executed by one or more processors, one or more of the methods described herein. The program logic may reside in a hard disk, or may also reside, completely or at least partially, within the RAM and/or within the processor during execution thereof by the processing system. Thus, the memory and the processor also constitute computer-readable medium on which is encoded program logic, e.g., in the form of instructions.

Furthermore, a computer-readable medium may form, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the logic including instructions, those in the art will understand that many of the components described above are included, but not explicitly shown or described in order not to obscure the inventive aspect. For example, while only a single machine is illustrated, the term “machine” shall also be taken to include any collection of machines that individually or jointly execute a set (or multiple sets) of instructions to perform any one or more of the methodologies discussed herein.

Thus, one embodiment of each of the methods described herein is in the form of a computer-readable medium configured with a set of instructions, e.g., a computer program that is for execution on one or more processors, e.g., one or more processors that are part of signal processing apparatus. Thus, as will be appreciated by those skilled in the art, embodiments of the present invention may be embodied as a method, an apparatus such as a special purpose apparatus, an apparatus such as a data processing system, or a computer-readable medium, e.g., a computer program product. The computer-readable medium carries logic including a set of instructions that when executed on one or more processors cause carrying out method steps. Accordingly, aspects of the present invention may take the form of a method, an entirely hardware embodiment, an entirely software embodiment or an embodiment combining software and hardware aspects. Furthermore, the present invention may take the form of program logic, e.g., in a computer readable medium, e.g., a computer program on a computer-readable storage medium, or the computer readable medium configured with computer-readable program code, e.g., a computer program product.

While the computer readable medium is shown in an example embodiment to be a single medium, the term “medium” should be taken to include a single medium or multiple media (e.g., a centralized or distributed database, and/or associated caches and servers) that store the one or more sets of instructions. The term “computer readable medium” shall also be taken to include any computer readable medium that is capable of storing, encoding or otherwise configured with a set of instructions for execution by one or more of the processors and that cause the carrying out of any one or more of the methodologies of the present invention. A computer readable medium may take many forms, including but not limited to non-volatile media and volatile media. Non-volatile media includes, for example, optical, magnetic disks, and magneto-optical disks. Volatile media includes dynamic memory, such as main memory.

It will be understood that the steps of methods discussed are performed in one embodiment by an appropriate processor (or processors) of a processing system (e.g., computer system) executing instructions stored in storage. It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to “one embodiment” or “an embodiment” means that a particular feature, structure or characteristic described in connection with the embodiment is included in at least one embodiment of the present invention. Thus, appearances of the phrases “in one embodiment” or “in an embodiment” in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, many of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives “first”, “second”, “third”, etc., to describe a common object, merely indicate that different instances of like objects are being referred to, and are not intended to imply that the objects so described must be in a given sequence, either temporally, spatially, in ranking, or in any other manner.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noted that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. An apparatus for binauralizing a set of one or more audio input signals comprising:

a binauralizer implementing one or more pairs of binaural filters, one respective pair for each of the audio signal inputs, each pair of binaural filters having a left ear output and a right ear output, each pair of binaural filters representable by a left ear binaural filter and a right ear binaural filter, respectively, each pair of binaural filters further representable by a sum filter and a difference filter related to the left and right ear binaural filters, each filter having a respective impulse response that characterizes the filter, wherein at least one pair of binaural filters is configured to spatialize its respective audio input signal to incorporate a direct response to a listener from a respective virtual speaker location, and to incorporate both early echoes and a reverberant response of a listening room, and wherein for the at least one pair of binaural filters configured to spatialize:

the time-frequency characteristics of the sum filter are different than the time-frequency characteristics of the difference filter, with the sum filter reverberation time smaller at all frequencies than each of: the difference filter reverberation time, the left ear filter reverberation time, and the right ear filter reverberation time; and the sum filter reverberation time varies more across different frequencies than the respective variation over frequencies of the left ear filter reverberation time and of the right ear filter reverberation time, with the sum filter reverberation time decreasing with increasing frequency, such that the one or more audio input signals filtered by the pair of binaural filters generate output signals that are perceived as spatialized when played through headphones and sound good when played monophonically after a monophonic mix achieved by downmixing or by playing over relatively closely spaced loudspeakers, wherein for the at least one pair of binaural filters, the transition of the sum filter impulse response to its negligible level occurs gradually over time in a frequency dependent manner over an initial time interval of the sum filter impulse response, wherein for the at least one pair of binaural filters, the sum filter decreases in frequency content from being initially full bandwidth towards a low frequency cutoff over the transition time interval.

2. An apparatus as recited in claim 1, wherein for the at least one pair of binaural filters, the transition time interval is such that the sum filter impulse response transitions from full bandwidth up to about 3 ms to below 100 Hz at about 40 ms.

3. An apparatus as recited in claim 1, wherein for the at least one pair of binaural filters, the difference filter reverberation time at high frequencies of above 10 kHz is less than 40 ms, the difference filter reverberation time at frequencies of between 3 kHz and 4 kHz, is less than 100 ms, and at frequencies less than 2 kHz, the difference filter reverberation time is less than 160 ms.

4. An apparatus as recited in claim 1, wherein for the at least one pair of binaural filters, the difference filter reverberation time at high frequencies of above 10 kHz is less than 20 ms, the difference filter reverberation time at frequencies of between 3 kHz and 4 kHz, is less than 60 ms, and at frequencies less than 2 kHz, the difference filter reverberation time is less than 120 ms.

5. An apparatus as recited in claim 1, wherein for the at least one pair of binaural filters, the difference filter reverberation time at high frequencies of above 10 kHz is less than 10 ms, the difference filter reverberation time at frequencies of between 3 kHz and 4 kHz, is less than 40 ms, and at frequencies less than 2 kHz, the difference filter reverberation time is less than 80 ms.

6. An apparatus as recited in claim 1, wherein for the at least one pair of binaural filters, the difference filter reverberation time is less than about 800 ms.

7. An apparatus as recited in claim 1, wherein for the at least one pair of binaural filters, the difference filter reverberation time is less than about 400 ms.

8. An apparatus as recited in claim 1, wherein for the at least one pair of binaural filters, the difference filter reverberation time is less than about 200 ms.

9. An apparatus as recited in claim 1, wherein for the at least one pair of binaural filters, the sum filter reverberation time decreases as the frequency increases, the sum filter reverberation time for all frequencies less than 100 Hz is at least 40 ms and at most 160 ms, the sum filter reverberation time for all frequencies between 100 Hz and 1 kHz is at least 20 ms and at most 80 ms, the sum filter reverberation time for all frequencies between 1 kHz and 2 kHz is at least 10 ms and at most 20 ms, and the sum filter reverberation time for all frequencies between 2 kHz and 20 kHz is at least 5 ms and at most 20 ms.

10. An apparatus as recited in claim 1, wherein for the at least one pair of binaural filters, the sum filter reverberation time decreases as the frequency increases, the sum filter reverberation time for all frequencies less than 100 Hz is at least 60 ms and at most 120 ms, the sum filter reverberation time for all frequencies between 100 Hz and 1 kHz is at least 30 ms and at most 60 ms, the sum filter reverberation time for all frequencies between 1 kHz and 2 kHz is at least 15 ms and at most 30 ms, and the sum filter reverberation time for all frequencies between 2 kHz and 20 kHz is at least 7 ms and at most 15 ms.

11. An apparatus as recited in claim 1, wherein for the at least one pair of binaural filters, the sum filter reverberation time decreases as the frequency increases, the sum filter reverberation time for all frequencies less than 100 Hz is at least 70 ms and at most 90 ms, the sum filter reverberation time for all frequencies between 100 Hz and 1 kHz is at least 35 ms and at most 50 ms, the sum filter reverberation time for all frequencies between 1 kHz and 2 kHz is at least 18 ms and at most 25 ms, and the sum filter reverberation time for all frequencies between 2 kHz and 20 kHz is at least 8 ms and at most 12 ms.

12. An apparatus as recited in claim 1, wherein for the at least one pair of binaural filters, the binaural filter characteristics are determined from a pair of to-be-matched binaural filter characteristics.

13. An apparatus as recited in claim 12, wherein for the at least one pair of binaural filters, the difference filter impulse response is at later times proportional to the difference filter of the to-be-matched binaural filter.

14. An apparatus as recited in claim 13, wherein for the at least one pair of binaural filters, the difference filter impulse response becomes after 40 ms proportional to the difference filter of the to-be-matched binaural filter.

15. A method of binauralizing a set of one or more audio input signals, the method comprising:

filtering the set of audio input signals by a binauralizer implementing one or more pairs of binaural filters, one respective pair for each of the audio signal inputs, each pair of binaural filters having a left ear output and a right ear output, each pair of binaural filters representable by a left ear binaural filter and a right ear binaural filter, respectively, each pair of binaural filters further representable by a sum filter and a difference filter related to the left and right ear binaural filters, each filter having a respective impulse response that characterizes the filter, wherein at least one pair of binaural filters is configured to spatialize its respective audio input signal to incorporate a direct response to a listener from a respective virtual speaker location, and to incorporate both early echoes and a reverberant response of a listening room, and wherein for the at least one pair of binaural filters configured to spatialize:

the time-frequency characteristics of the sum filter are different than the time-frequency characteristics of the difference filter, with the sum filter reverberation time smaller at all frequencies than each of: the difference filter reverberation time, the left ear filter reverberation time, and the right ear filter reverberation time; and the sum filter reverberation time varies more across different frequencies that the respective variation over frequencies of the left ear filter reverberation time and of the right ear filter reverberation time, with the sum filter reverberation time decreasing with increasing frequency, such that the outputs are perceived as spatialized when played through headphones and sound good when played monophonically after a monophonic mix achieved by downmixing or by playing over relatively closely spaced loudspeakers, wherein for the at least one pair of binaural filters, the transition of the sum filter impulse response to its negligible level occurs gradually over time in a frequency dependent manner over an initial time interval of the sum filter impulse response, wherein for the at least one pair of binaural filters, the sum filter decreases in frequency content from being initially full bandwidth towards a low frequency cutoff over the transition time interval.

16. A method as recited in claim 15, wherein for the at least one pair of binaural filters, the transition time interval is such that the sum filter impulse response transitions from full bandwidth up to about 3 ms to below 100 Hz at about 40 ms.

17. A method as recited in claim 15, wherein for the at least one pair of binaural filters, the difference filter reverberation time at high frequencies of above 10 kHz is less than 40 ms, the difference filter reverberation time at frequencies of between 3 kHz and 4 kHz, is less than 100 ms, and at frequencies less than 2 kHz, the difference filter reverberation time is less than 160 ms.

18. A method as recited in claim 15, wherein for the at least one pair of binaural filters, the difference filter reverberation time at high frequencies of above 10 kHz is less than 20 ms, the difference filter reverberation time at frequencies of between 3 kHz and 4 kHz, is less than 60 ms, and at frequencies less than 2 kHz, the difference filter reverberation time is less than 120 ms.

19. A method as recited in claim 15, wherein for the at least one pair of binaural filters, the difference filter reverberation time at high frequencies of above 10 kHz is less than 10 ms, the difference filter reverberation time at frequencies of between 3 kHz and 4 kHz, is less than 40 ms, and at frequencies less than 2 kHz, the difference filter reverberation time is less than 80 ms.

20. A method as recited in claim 15, wherein for the at least one pair of binaural filters, the difference filter reverberation time is less than about 800 ms.

21. A method as recited in claim 15, wherein for the at least one pair of binaural filters, the difference filter reverberation time is less than about 400 ms.

22. A method as recited in claim 15, wherein for the at least one pair of binaural filters, the difference filter reverberation time is less than about 200 ms.

23. A method as recited in claim 15, wherein for the at least one pair of binaural filters, the sum filter reverberation time decreases as the frequency increases, the sum filter reverberation time for all frequencies less than 100 Hz is at least 40 ms and at most 160 ms, the sum filter reverberation time for all frequencies between 100 Hz and 1 kHz is at least 20 ms and at most 80 ms, the sum filter reverberation time for all frequencies between 1 kHz and 2 kHz is at least 10 ms and at most 20 ms, and the sum filter reverberation time for all frequencies between 2 kHz and 20 kHz is at least 5 ms and at most 20 ms.

24. A method as recited in claim 15, wherein for the at least one pair of binaural filters, the sum filter reverberation time decreases as the frequency increases, the sum filter reverberation time for all frequencies less than 100 Hz is at least 60 ms and at most 120 ms, the sum filter reverberation time for all frequencies between 100 Hz and 1 kHz is at least 30 ms and at most 60 ms, the sum filter reverberation time for all frequencies between 1 kHz and 2 kHz is at least 15 ms and at most 30 ms, and the sum filter reverberation time for all frequencies between 2 kHz and 20 kHz is at least 7 ms and at most 15 ms.

25. A method as recited in claim 15, wherein for the at least one pair of binaural filters, the sum filter reverberation time decreases as the frequency increases, the sum filter reverberation time for all frequencies less than 100 Hz is at least 70 ms and at most 90 ms, the sum filter reverberation time for all frequencies between 100 Hz and 1 kHz is at least 35 ms and at most 50 ms, the sum filter reverberation time for all frequencies between 1 kHz and 2 kHz is at least 18 ms and at most 25 ms, and the sum filter reverberation time for all frequencies between 2 kHz and 20 kHz is at least 8 ms and at most 12 ms.

26. A method as recited in claim 15, wherein for the at least one pair of binaural filters, the binaural filter characteristics are determined from a pair of to-be-matched binaural filter characteristics.

27. A method of processing a pair of signals to generate modified binaural filters, the method comprising:

accepting a pair of signals representing the impulse responses of a corresponding pair of to-be-matched binaural filters configured to binauralize an audio signal;

processing a sum filter and difference filter representation of the pair of accepted signals by a pair of filters each characterized by a modifying filter that has time varying filter characteristics, the processing forming a sum filter and difference filter representation of a pair of modified signals representing the impulse responses of a corresponding pair of modified binaural filters, such that the modified binaural filters are configured to binauralize an audio signal and further have the property of low perceived reverberation in a monophonic mix down, and minimal impact on the binaural filters over headphones wherein modified binaural filters are characterizable by a modified sum filter and a modified difference filters, and wherein the time varying filters are configured such that:

modified binaural filters impulse responses include a direct part defined by head related transfer functions for a listener listening to a virtual speaker at a predefined location;

the modified sum filter has a reduced level and a shorter reverberation time compared to the modified difference filter, and there is a smooth transition from the direct part of the impulse response of the sum filter to the negligible response part of the sum filter, with smooth transition being frequency selective over time.

28. A method as recited in claim 27, wherein the modifying time varying filter is representable by a sum modifying filter operating on a signal representing, the sum filter of the to-be-matched binaural filters, and a difference modifying filter operating on a signal representing the difference filter of the to-be-matched binaural filters, wherein the sum modifying filter substantially attenuates the signal representing the sum filter of the to-be-matched binaural filters for times later than 40 ms, and wherein the difference modifying filter is definable by the time varying characteristics of the sum modifying filter.

29. A method as recited in claim 28, wherein the sum modifying filter is characterizable by a time varying impulse response at time denoted t to an impulse at time t=τ by f(t,τ), and wherein the sum modifying filter is also characterizable by a time varying frequency response, including a time varying bandwidth, wherein the impulse response of the difference modifying filter is determinable from f(t,τ) by and wherein the time varying bandwidth is monotonically decreasing in time.

30. A method as recited in claim 29, wherein the time varying bandwidth decreases to smoothly to less than 100 Hz for times greater than approximately 40 ms.

31. A method as recited in claim 29, wherein the impulse response of the difference modifying filter is proportional to $\sqrt{2}_{D0}(t)-(\sqrt{2}-1)\int h_{D0}(t-\tau)f(t,\tau)\cdot d\tau$, where $h_{D0}(t)$ denotes the difference signal resulting from the shuffling.

32. A method of processing a left ear signal and right ear signal to generate modified binaural filters, the method comprising:

accepting a left ear signal and right ear signal representing the impulse responses of corresponding left ear and right ear binaural filters configured to binauralize an audio signal;

shuffling the left ear signal and right ear signal to form a sum signal proportional to the sum of the left and right ear signals and a difference signal proportional to difference between the left ear signal and the right ear signal;

filtering the sum signal by a sum filter that has time varying filter characteristics, the filtering forming a filtered sum signal;

processing the difference signal by a difference filter that is characterized by the sum filter, the processing forming a filtered difference signal;

unshuffling the filtered sum signal and the filtered difference signal to form a modified left ear signal and modified right ear signal representing the impulse responses of corresponding left ear and right ear modified binaural filters, wherein the modified binaural filters are configured to binauralize an audio signal, are each representable by a respective modified sum filter and a respective modified difference filter, and further have a left ear output and a right ear output, each pair of binaural filters representable by a left ear binaural filter and a right ear binaural filter, respectively, each filter having a respective impulse response that characterizes the filter, wherein at least one pair of binaural filters is configured to spatialize its respective audio input signal to incorporate a direct response to a listener from a respective virtual speaker location, and to incorporate both early echoes and a reverberant response of a listening room, and wherein for the at least one pair of binaural filters:

the time-frequency characteristics of the sum filter are different than the time-frequency characteristics of the difference filter, with the sum filter reverberation time smaller at all frequencies than each of: the difference filter reverberation time, the left ear filter reverberation time, and the right ear filter reverberation time; and the sum filter reverberation time varies more across different frequencies than the respective variation over frequencies of the left ear filter reverberation time and of the right ear filter reverberation time, with the sum filter reverberation time decreasing with increasing frequency, such that the one or more audio input signals filtered by the pair of binaural filters generate output signals that are perceived as spatialized when played through headphones and sound good when played monophonically after a monophonic mix achieved by downmixing or by playing over relatively closely spaced loudspeakers, wherein for the at least one pair of binaural filters, the transition of the sum filter impulse response to its negligible level occurs gradually over time in a frequency dependent manner over an initial time interval of the sum filter impulse response, wherein for the at least one pair of binaural filters, the sum filter decreases in frequency content from being initially full bandwidth towards a low frequency cutoff over the transition time interval.

33. A method as recited in claim 32, wherein the modified sum signal is boosted appropriately to compensate for any lost energy in the modified difference signal caused by the time varying filtering.

34. A non-transitory computer readable storage medium configured with instructions that when executed by at least one processor of a processing system causes carrying out a method of binauralizing a set of one or more audio input signals, the method comprising:

filtering the set of audio input signals by a binauralizer implementing one or more pairs of binaural filters, one respective pair for each of the audio signal inputs, each pair of binaural filters having a left ear output and a right ear output, each pair of binaural filters representable by a left ear binaural filter and a right ear binaural filter, respectively, each pair of binaural filters further representable by a sum filter and a difference filter related to the left and right ear binaural filters, each filter having a respective impulse response that characterizes the filter, wherein at least one pair of binaural filters is configured to spatialize its respective audio input signal to incorporate a direct response to a listener from a respective virtual speaker location, and to incorporate both early echoes and a reverberant response of a listening room, and wherein for the at least one pair of binaural filters:

the time-frequency characteristics of the sum filter are different than the time-frequency characteristics of the difference filter, with the sum filter reverberation time smaller at all frequencies than each of: the difference filter reverberation time, the left ear filter reverberation time, and the right ear filter reverberation time; and the sum filter reverberation time varies more across different frequencies that the respective variation over frequencies of the left ear filter reverberation time and of the right ear filter reverberation time, with the sum filter reverberation time decreasing with increasing frequency, such that the outputs are perceived as spatialized when played through headphones and sound good when played monophonically after a monophonic mix achieved by downmixing or by playing over relatively closely spaced loudspeakers, wherein for the at least one pair of binaural filters, the transition of the sum filter impulse response to its negligible level occurs gradually over time in a frequency dependent manner over an initial time interval of the sum filter impulse response, wherein for the at least one pair of binaural filters, the sum filter decreases in frequency content from being initially full bandwidth towards a low frequency cutoff over the transition time interval.

35. A non-transitory computer readable storage medium configured with instructions that when executed by at least one processor of a processing system causes carrying out a method of processing a pair of signals to generate modified binaural filters, the method comprising:

accepting a pair of signals representing the impulse responses of a corresponding pair of to-be-matched binaural filters configured to binauralize an audio signal;

processing a sum filter and difference filter representation of the pair of accepted signals by a pair of filters each characterized by a modifying filter that has time varying filter characteristics, the processing forming a sum filter and difference filter representation of a pair of modified signals representing the impulse responses of a corresponding pair of modified binaural filters, such that the modified binaural filters are configured to binauralize an audio signal and further have the property of low perceived reverberation in a monophonic mix down, and minimal impact on the binaural filters over headphones wherein modified binaural filters are characterizable by a modified sum filter and a modified difference filters, and wherein the time varying filters are configured such that:

modified binaural filters impulse responses include a direct part defined by head related transfer functions for a listener listening to a virtual speaker at a predefined location;

the modified sum filter has a reduced level and a shorter reverberation time compared to the modified difference filter, and there is a smooth transition from the direct part of the impulse response of the sum filter to the negligible response part of the sum filter, with smooth transition being frequency selective over time.

36. A non-transitory computer readable storage medium configured with instructions that when executed by at least one processor of a processing system causes carrying out a method of processing a left ear signal and right ear signal to generate modified binaural filters, the method comprising:

accepting a left ear signal and right ear signal representing the impulse responses of corresponding left ear and right ear binaural filters configured to binauralize an audio signal;

shuffling the left ear signal and right ear signal to form a sum signal proportional to the sum of the left and right ear signals and a difference signal proportional to difference between the left ear signal and the right ear signal;

filtering the sum signal by a sum filter that has time varying filter characteristics, the filtering forming a filtered sum signal;

processing the difference signal by a difference filter that is characterized by the sum filter, the processing forming a filtered difference signal;

unshuffling the filtered sum signal and the filtered difference signal to form a modified left ear signal and modified right ear signal representing the impulse responses of corresponding left ear and right ear modified binaural filters, wherein the modified binaural filters are configured to binauralize an audio signal, are each representable by a respective modified sum filter and a respective modified difference filter, and further have a left ear output and a right ear output, each pair of binaural filters representable by a left ear binaural filter and a right ear binaural filter, respectively, each filter having a respective impulse response that characterizes the filter, wherein at least one pair of binaural filters is configured to spatialize its respective audio input signal to incorporate a direct response to a listener from a respective virtual speaker location, and to incorporate both early echoes and a reverberant response of a listening room, and wherein for the at least one pair of binaural filters:

the time-frequency characteristics of the sum filter are different than the time-frequency characteristics of the difference filter, with the sum filter reverberation time smaller at all frequencies than each of: the difference filter reverberation time, the left ear filter reverberation time, and the right ear filter reverberation time; and the sum filter reverberation time varies more across different frequencies than the respective variation over frequencies of the left ear filter reverberation time and of the right ear filter reverberation time, with the sum filter reverberation time decreasing with increasing frequency, such that the one or more audio input signals filtered by the pair of binaural filters generate output signals that are perceived as spatialized when played through headphones and sound good when played monophonically after a monophonic mix achieved by downmixing or by playing over relatively closely spaced loudspeakers, wherein for the at least one pair of binaural filters, the transition of the sum filter impulse response to its negligible level occurs gradually over time in a frequency dependent manner over an initial time interval of the sum filter impulse response, wherein for the at least one pair of binaural filters, the sum filter decreases in frequency content from being initially full bandwidth towards a low frequency cutoff over the transition time interval.

* * * * *

UNITED STATES PATENT AND TRADEMARK OFFICE

CERTIFICATE OF CORRECTION

PATENT NO. : 8,515,104 B2
APPLICATION NO. : 13/070289
DATED : August 20, 2013
INVENTOR(S) : Dickins et al.

It is certified that error appears in the above-identified patent and that said Letters Patent is hereby corrected as shown below:

Title page, Item (73) Assignee, change “Dobly” to --Dolby--.

Signed and Sealed this
Twenty-fifth Day of March, 2014

Michelle K. Lee
*Deputy Director of the United States Patent and Trademark Office*